US012710449B2

(12) United States Patent
Yang et al.

(10) Patent No.: US 12,710,449 B2
(45) Date of Patent: Aug. 18, 2026

(54) PROBE SYSTEM FOR TESTING OF DEVICES UNDER TEST INTEGRATED ON A SEMICONDUCTOR WAFER, AND PROBE CARD, PROBE HEAD, AND GUIDING PLATE STRUCTURE THEREIN

(71) Applicant: MPI CORPORATION, Hsinchu (TW)

(72) Inventors: Chin-Tien Yang, Hsinchu (TW); Yu-Hao Chen, Hsinchu (TW); Hui-Pin Yang, Hsinchu (TW); Chi-Hsien Li, Hsinchu (TW)

(73) Assignee: MPI CORPORATION, Hsinchu (TW)

( * ) Notice: Subject to any disclaimer, the term of this patent is extended or adjusted under 35 U.S.C. 154(b) by 177 days.

(21) Appl. No.: 18/645,592

(22) Filed: Apr. 25, 2024

(65) Prior Publication Data

US 2024/0393367 A1 Nov. 28, 2024

Related U.S. Application Data

(60) Provisional application No. 63/462,947, filed on Apr. 28, 2023.

(51) Int. Cl.
*G01R 1/067* (2006.01)
*G01R 1/073* (2006.01)

(52) U.S. Cl.
CPC ..... *G01R 1/06755* (2013.01); *G01R 1/06733* (2013.01); *G01R 1/07342* (2013.01)

(58) Field of Classification Search
None
See application file for complete search history.

(56) References Cited

U.S. PATENT DOCUMENTS 7,876,114 B2 1/2011 Campbell et al.
2003/0006788 A1* 1/2003 Ido .................... G01R 1/07378 324/756.03
2011/0267088 A1 11/2011 Zelder et al.
(Continued)

FOREIGN PATENT DOCUMENTS

CN 102112884 A 6/2011
CN 110389242 A 10/2019
(Continued)

OTHER PUBLICATIONS

Taiwan Patent Office, “Office Action”, Feb. 13, 2025, Taiwan.

*Primary Examiner* — Jas A Sanghera
(74) *Attorney, Agent, or Firm* — Troutman Pepper Locke LLP; Tim Tingkang Xia, Esq.

(57) ABSTRACT

A probe head includes multiple probes and guide plates. Each probe includes a first end, a second end, and a probe body. The first end abuts a contact pad of a device under test. The second end abuts a contact pad of a board of a probe system. The probe body extends between the first end and the second end according to a longitudinal development axis. The guide plate includes a guide-hole pair for a probe pair of the probe head to respectively pass through, and the guide-hole pair slidably accommodate the pair of probes. The guide plate further includes an extension hole extending from one guide hole of the guide-hole pair to another guide hole to provide compensating impedance between the guide-hole pair, improve impedance matching when probing the device under test with the probe pair, and reduce return loss between the probe head and the device under test.

24 Claims, 14 Drawing Sheets

(56) References Cited

U.S. PATENT DOCUMENTS

| | | | | |
|---|---|---|---|---|
| 2014/0266275 | A1* | 9/2014 | Kimura | G01R 1/07357 324/750.25 |
| 2018/0052190 | A1* | 2/2018 | Perego | G01R 1/06733 |
| 2019/0064219 | A1* | 2/2019 | Rhee | G01R 1/07378 |
| 2020/0018779 | A1* | 1/2020 | Kato | G01R 31/70 |
| 2020/0166564 | A1 | 5/2020 | Takano et al. | |
| 2021/0048452 | A1* | 2/2021 | Yang | G01R 1/06722 |
| 2021/0190827 | A1* | 6/2021 | Brecht | G01R 1/07378 |
| 2022/0011345 | A1 | 1/2022 | Inuma et al. | |
| 2022/0018877 | A1 | 1/2022 | Inuma et al. | |
| 2023/0138105 | A1 | 5/2023 | Inuma et al. | |

FOREIGN PATENT DOCUMENTS

| | | | |
|---|---|---|---|
| JP | 2001281282 | A | 10/2001 |
| TW | 201525466 | A | 7/2015 |
| TW | 202020463 | A | 6/2020 |
| TW | 202022388 | A | 6/2020 |
| TW | 202032136 | A | 9/2020 |
| TW | 202136789 | A | 10/2021 |

* cited by examiner

PROBE SYSTEM FOR TESTING OF DEVICES UNDER TEST INTEGRATED ON A SEMICONDUCTOR WAFER, AND PROBE CARD, PROBE HEAD, AND GUIDING PLATE STRUCTURE THEREIN

CROSS-REFERENCE TO RELATED APPLICATIONS

This application claims priority to U.S. Provisional Application No. 63/462,947 filed on Apr. 28, 2023, the contents of which are incorporated herein by reference.

BACKGROUND OF THE INVENTION

The present invention relates to a probe head and a guide plate structure in the probe head. More specifically, the present invention relates to a probe head and a guide plate structure thereof which reduce the return loss between a probe card including the probe head and a device under test.

As a tool for testing the electrical properties of a semiconductor wafer or a packaged device, a probe card may generally comprise at least a probe head, a space transformer, and a circuit board. The probe head may comprise a plurality of probes, and each of the plurality of probes may contact a device under test (DUT) integrated in a semiconductor wafer to test the electrical performance of the device under test.

In recent years, the demand for high-frequency/high-speed testing of electronic devices under test is increasing day by day, and with the increase of data transmission rate during testing (e.g., from 50 to 60 Gigabits per second (Gbps) to more than 100 Gbps), the influence of impedance matching between the probe head and the device under test on high-speed signal transmission has become more and more significant. The influence of return loss becomes significant when the impedances on the test path (i.e., the signal transmission path) are not matched.

However, since the probe head not only comprises electronic components but also comprises non-electronic components (e.g., probes and guide plates), mechanical characteristics of these components must be taken into account in the design of impedance matching thereof. Such design is more difficult than the space transformer and the wiring substrate (e.g., printed circuit board, PCB) disposed thereon because it involves different types of components, and the influence of the mechanical structure needs to be considered in the electrical design. Accordingly, an urgent need exists in the art to improve the impedance matching between the probe head and the device under test.

SUMMARY OF THE INVENTION

In order to at least solve the above technical problems, the present invention provides a guide plate structure of a probe head of a probe system for testing a device under test integrated in a semiconductor wafer. The guide plate structure may comprise a first guide plate. The first guide plate may comprise a pair of first guide holes for a pair of probes of the probe head to respectively pass through and extend according to a longitudinal development axis, and the pair of first guide holes are configured to slidably accommodate the pair of probes. The first guide plate may further comprise a first extension hole extending from one of the pair of first guide holes to the other, and the first extension hole is configured to provide a compensating impedance between the pair of first guide holes. The compensating impedance may be used for improving impedance matching when probing the device under test with the pair of probes so as to reduce a return loss between the probe head and the device under test.

In order to at least solve the above technical problems, the present invention further provides a probe head of a probe system for testing a device under test integrated in a semiconductor wafer. The probe head may comprise a pair of probes, and each probe may comprise a first end, a second end a probe body. The first end ends at a contact tip and may be configured to abut a contact pad of the device under test. The second end ends at a contact bottom and may be configured to abut a contact pad of a board of the probe system. The probe body may extend between the first end and the second end according to a longitudinal development axis. Moreover, the probe head may further comprise the guide plate structure as described above.

In order to at least solve the above technical problems, the present invention further provides a probe card of a probe system for testing a device under test integrated in a semiconductor wafer. The probe card may comprise a circuit board, a space transformer arranged on the circuit board, and a probe head as described above. The probe head may be arranged on the other side of the space transformer opposite to the circuit board, and a second end of each of the plurality of probes in the probe head is configured to be electrically connected to the space transformer.

In order to at least solve the above technical problems, the present invention further provides a probe system for testing a device under test integrated in a semiconductor wafer. The probe system may include a chuck, a testing apparatus, and a probe card as described above. The chuck may be used for supporting the semiconductor wafer. The testing apparatus may be electrically connected with the device under test (i.e., the object to be tested) and used for establishing an electrical test program. The probe card may be arranged in the probe system.

According to the above descriptions, the probe head and the guide plate structure thereof provided by the present invention are provided with an extension hole between a pair of guide holes for accommodating a differential pair of probes, and thus as compared to the transmission of differential-pair signals without the extension hole in the prior art, the guide plate structure of the present invention reduces the equivalent dielectric constant between the differential pair of probes, so that the impedance fluctuation caused by the guide plate between the pair of probes can be effectively reduced, and the return loss between the probe head as a whole and the object to be tested is further reduced. That is, the impedance matching between the probe head (even the probe card to which the probe head belongs) and the object to be tested is improved. The more pairs of probes for differential signals are the above mechanism provided by the present invention applied to, the higher improvement effect can be obtained.

The above content provides a basic description of the present invention, including the technical problems solved by the present invention, the technical means adopted by the present invention and the technical effects achieved by the present invention, and various embodiments of the present invention will be further exemplified in the following description.

What shown in FIG. 1, FIG. 3 to FIG. 12, and FIG. 14 are only exemplary examples for explaining embodiments of the present invention and are not intended to limit the scopes of the claimed inventions.

DETAILED DESCRIPTION OF THE INVENTION

The following embodiments are not intended to limit the invention to be claimed to a specific environment, application, structure, process, or situation. In the attached drawings, elements unrelated to the invention to be claimed will be omitted. In the attached drawings, dimensions of and dimensional scales among individual elements are provided only as exemplary examples and are not intended to limit the invention to be claimed. The same element symbols in the follow description may refer to the same elements unless otherwise specified.

Terminology described herein is only for ease of description of the content of the embodiments and is not intended to limit the invention to be claimed. Unless otherwise specified clearly, singular forms "a" or "an" shall be deemed to include the plural forms as well. Terms such as "including", "comprising" and "having" are used to specify the existence of features, integers, steps, operations, elements, components and/or groups stated after the terms, but do not exclude the existence or addition of one or more other additional features, integers, steps, operations, elements, components and/or groups or the like. The term "and/or" is used to indicate any one or all combinations of one or more related items enumerated. When the terms "first", "second" and "third" are used to describe elements, the terms are not intended to limit but only distinguish these described elements. Therefore, for example, a first element may also be named as a second element without departing from the spirit or scope of the invention to be claimed.

Figure 1:
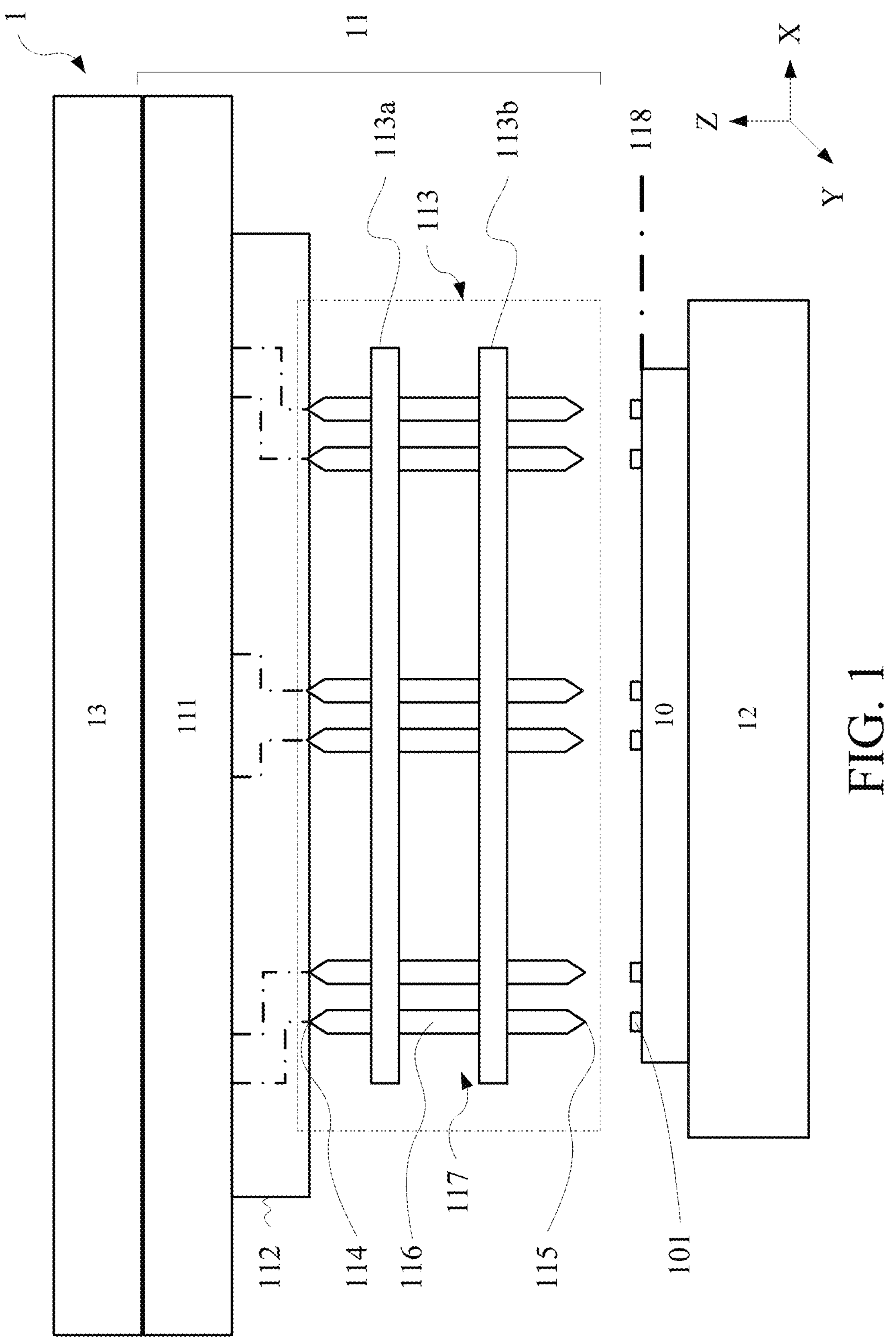
FIG. 1 illustrates a wafer testing system in which a probe head and a guide plate structure are located according to one or more embodiments of the present invention.

Please refer to FIG. 1, which demonstrates a probe system 1. The probe system 1 may at least comprise a probe card 11 and a chuck 12. The probe card 11 may be used to electrically connect and/or mechanically contact a device under test 10 and to test the electrical performance of the device under test 10. The probe card 11 may be configured to test the device under test 10. The device under test 10 may be semiconductor wafers. The chuck 12 may be used to support the device under test 10 for probing by the probe card 11. The device under test 10 may comprise one or more contact pads (e.g., a contact pad 101 shown in FIG. 1) such that the probe tip is configured to contact the one or more contact pads during testing of the device under test 10.

The probe card 11 may comprise a circuit board 111, a space transformer 112, and a probe head 113. The space transformer 112 may be disposed on the circuit board 111, and the probe head 113 may be disposed on the space transformer 112. The probe head 113 may basically comprise a plurality of probes and at least one guide plate, and one end of each probe may be electrically connected with the circuit board 111 through the space transformer 112, and the other end of each probe may be in contact with a contact pad (e.g., a metal pad or a conductor bump) on the device under test 10 during testing. It shall be noted that the above-mentioned space transformer 112 is described as being disposed on the circuit board 111 simply according to the conventional dimensional relationship between the space transformer 112 and the circuit board 111, and it is not intended to limit that the space transformer 112 must be located above the circuit board 111 in the physical sense.

The testing apparatus 13 may perform various test procedures and/or communicate test information to the device under test through the probe card 11. The testing apparatus 13 may be, for example, a test head of a prober. In some way of testing, there may be a Loopback test, in which the device under test 10 itself generates a required high-frequency test signal, and the high-frequency test signal, after passing through the probe card 11, is sent back to the device under test 10 for testing so as to determine whether the device under test works normally.

The circuit board 111 comprises a wafer side and a tester side. The wafer side of the circuit board 111 and the tester side of the circuit board 111 are disposed opposite to each other, and the tester side of the circuit board 111 is used for connecting a testing apparatus. In this embodiment, when the probe card 11 is used in the testing apparatus, the wafer side may be the lower side of the circuit board 111 which may face the space transformer 112 and/or the device under test, while the tester side may be the upper side of the circuit board 111 which may face away from the device under test and/or face the testing apparatus. In this embodiment, a general printed circuit board is adopted as the circuit board 111. The circuit board 111 has a top surface, a bottom surface and a variety of signal lines located therein, and contact pads electrically connected with the signal lines are formed on the top surface and the bottom surface. The contact pad on the top surface of the circuit board 111 is touched through the pogo pin of the testing apparatus. The test signal of the testing apparatus may be transmitted to the bottom surface of the circuit board 111 through the signal lines described above.

The space transformer 112 also comprises a wafer side and a tester side. Here it shall be noted that, the space transformer 112 may be composed of a multilayer circuit board. The tester side of the space transformer 112 is connected to the wafer side of the circuit board 111. In this embodiment, when the probe card 11 is used in the testing apparatus, the wafer side may be the lower side of the space transformer 112 which may face the probe head 113 and/or the device under test, while the tester side may be the upper side of the space transformer 112 which may face away from the device under test, face the circuit board 111, and/or face the testing apparatus. In this embodiment, the space transformer 112 comprises a multilayer organic (MLO) carrier or a multilayer ceramic (MLC) carrier, and the material thereof may be adjusted according to actual needs, which is not limited in the present invention. The space transformer 112 is provided with a variety of signal lines therein, and contact pads electrically connected with the internal signal lines thereof are formed on the top surface and the bottom surface of the space transformer 112, and the spacing between contact pads on the top surface is greater than the spacing between the contact pads on the bottom surface. The space transformer 112 is mechanically arranged on and electrically connected to the wafer side of the circuit board 111 (i.e., the bottom surface of the circuit board 111) and is located below the circuit board 111 so that the contact pads on the top surface of the space transformer 112 may be electrically connected to the contact pads on the bottom surface of the circuit board 111, and thus the signal lines inside the space transformer 112 are electrically connected with the signal lines of the circuit board 111. Here it shall be noted that, the space transformer 112 may also be mechanically arranged on and/or electrically connected to the wafer side of the circuit board 111 indirectly through another carrier (for example, a raised board) disposed between the space transformer 112 and the circuit board 111.

The probe head 113 may be mechanically arranged on and/or electrically connected to the wafer side of the space transformer 112. As shown in FIG. 1, the probe head 113 is in the form of a probe holder, and the probe head 113 comprises an upper guide plate unit 113*a*, a lower guide plate unit 113*b* and a plurality of probes. The upper guide plate unit 113*a* may comprise at least one upper guide plate, and the at least one upper guide plate may be provided with a plurality of upper guide holes. The lower guide plate unit 113*b* may comprise at least a lower guide plate, and the at least lower guide plate may be provided with a plurality of lower guide holes. The upper guide plate unit 113*a* and the lower guide plate unit 113*b* may be vertically arranged opposite to each other along a longitudinal development axis (e.g., substantially along the direction of the coordinate axis Z (hereinafter referred to as "Z axis" for short) of the local reference system in FIG. 1). Each probe passes through one of the plurality of upper guide holes and one of the plurality of lower guide holes.

As shown in FIG. 1, each probe may comprise a first end (e.g., an end 115 in FIG. 1), a second end (e.g., an end 114 in FIG. 1) and a probe body (e.g., a probe body 116 in FIG. 1) located between the first end and the second end. The first end may be the pinhead which ends at a contact tip, and the first end may be configured to abut a contact pad of the device under test 10 integrated in the semiconductor wafer. For example, the end 115 shown in FIG. 1 is configured to abut a contact pad 101 of the device under test 10. The pin bottom of each probe may pass through the upper guide hole of the upper guide plate unit to be electrically connected to the space transformer 112. The second end may be the pin bottom which ends at a contact bottom, and the second end may be configured to abut a contact pad of the space transformer 112. The probe body may be a pin body extending basically along the longitudinal development axis between the first end and the second end. The pinhead of each probe is used to make electrical contact with the device under test. The pinhead of each probe may be configured for electrical and/or contact communication with the corresponding contact pad of the device under test. In some examples, communication means that the probe may be configured to transmit test signals of the probe card 11 to the device under test 10 and/or receive signals from the device under test 10.

Many embodiments of the present invention relate to different embodiments of the probe head 113 and the guide plate structure in the probe head 113. It shall be noted, however, that although the probes and the guide plate structures in various embodiments of the present invention may vary slightly, the plurality of probes contained in the probe heads in various embodiments generally may all include at least one probe pair, and each probe pair may be used to transmit a pair of differential signals, that is, the probe pair is a differential pair. In a preferred embodiment of the present invention, the differential pair is used to transmit differential signals. That is, two single-ended signal lines (e.g., a P line and a N line) are used to connect TX+ and RX+, and TX− and RX− respectively to transmit signals at the same time, and these two signals have the same signal voltage amplitude but opposite signal phases.

Figure 2:
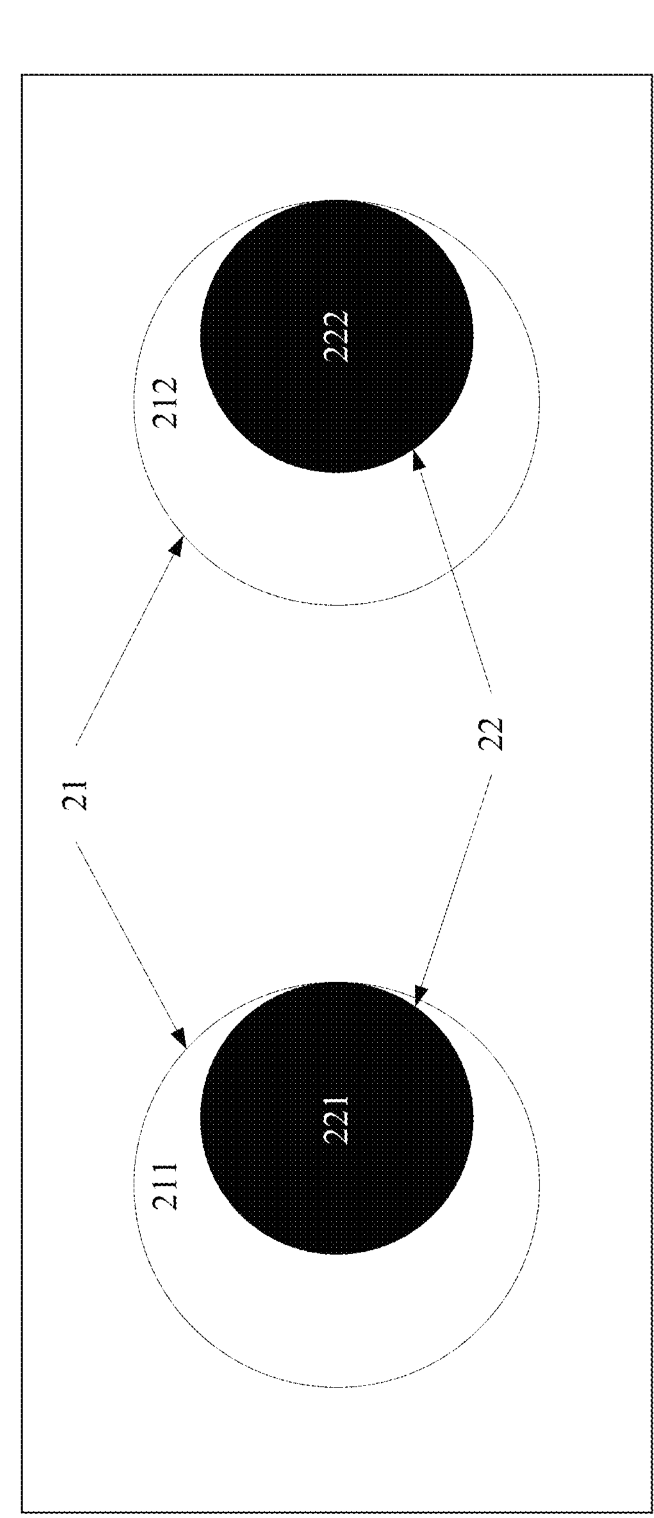
FIG. 2 illustrates a top view of a part of a guide plate structure in the prior art.

Referring to FIG. 2, which demonstrates a guide plate structure of each guide plate in the probe head in the prior art by taking a part of a guide plate 2 as an example. The guide plate 2 may comprise a guide-hole pair 21 which may respectively accommodate a probe pair 22. Two probes 221 and 222 in the probe pair 22 may be a differential pair. The probe 221 and the probe 222 respectively lean on two guide holes 211 and 212 in the guide-hole pair 21 on the right in the figure.

Figure 3:
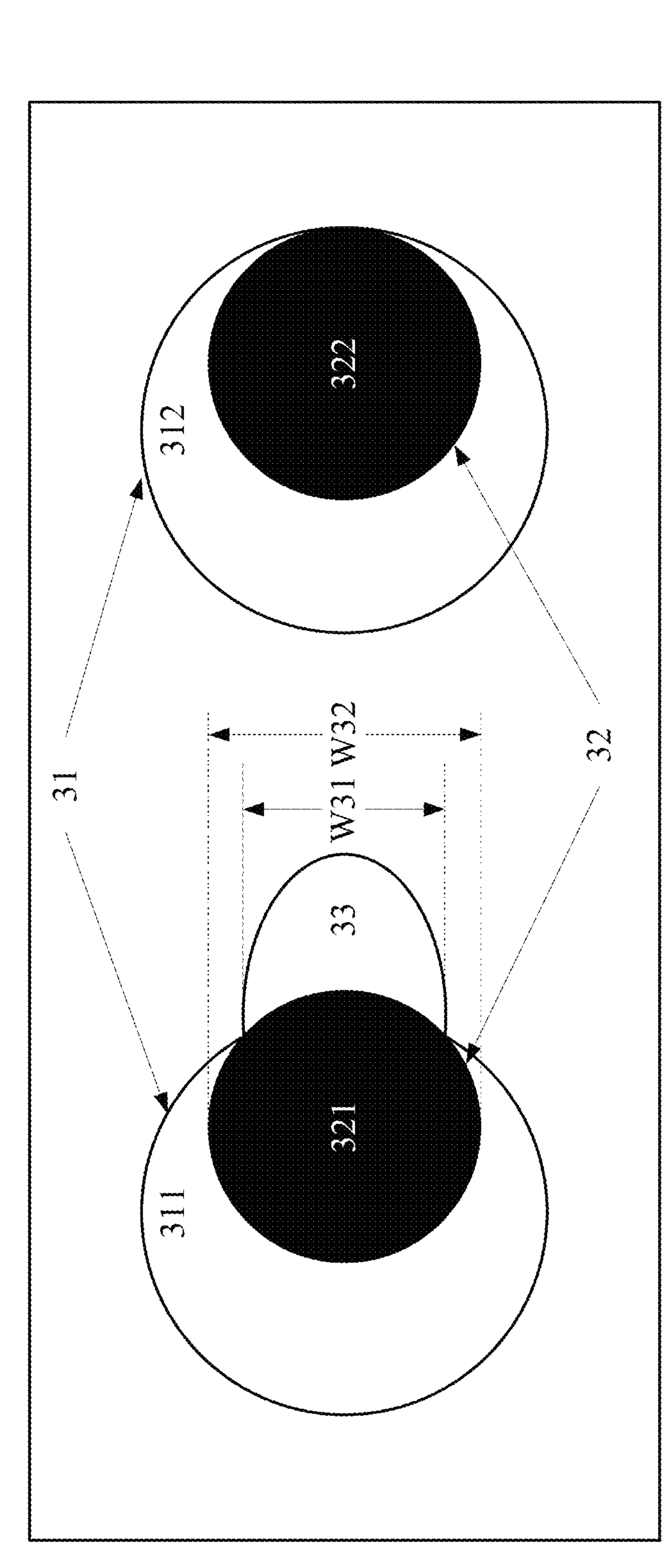
FIG. 3 to FIG. 10 illustrate a part of a guide plate structure according to one or more embodiments of the present invention.

Referring to FIG. 3, which demonstrates, by taking a part of a guide plate 3 as an example, a guide plate structure that may be included in each of at least one upper guide plate comprised in the upper guide plate unit 113*a* and at least one lower guide plate comprised in the lower guide plate unit 113*b*. The guide plate 3 may at least comprise a guide-hole pair 31 for a pair of probes (e.g., a probe pair 32 composed of a probe 321 and a probe 322 as shown in FIG. 3) of the probe head 113 to respectively pass through and extend according to the longitudinal development axis. The guide-hole pair 31 may be configured to slidably accommodate the probe pair 32.

The guide plate 3 may further comprise an extension hole 33 extending from one guide hole 311 to the other guide hole 312 in the guide-hole pair 31. As shown in FIG. 3, the shape of the extension hole 33 may be at least a part of an ellipse, and there may be an intersection area between the extension hole 33 and the guide hole 311 which together form one substantial guide hole. That is, the guide hole 311 and the extension hole 33 are in communication with each other. In some embodiments, the extension hole 33 may even have a complete elliptical shape and abut the guide hole 311, thereby forming one substantial guide hole together.

The extension hole 33 may be hollow, and there may be a joining position between the extension hole 33 and the guide hole 311. An opening width W31 (e.g., 30 micrometers) of the extension hole 33 at the joining position may be smaller than a probe width W32 (e.g., 50 micrometers) of the probe pair 32, which may prevent the probe 321 from moving into the extension hole 33 from the guide hole 311 when the probe 321 leans on the guide hole 311 on the right in the figure. Furthermore, since the extension hole 33 is hollow, the equivalent dielectric constant between the probe pair 32 is decreased. Therefore, as compared to the guide plate structure shown in FIG. 2, the extension hole 33 provides a compensating impedance between the guide-hole pair 31, and the compensating impedance is used for improving the impedance matching when probing the device under test 10 with the probe pair 32, so as to reduce a return loss between the probe head 113 and the device under test 10. As shown in FIG. 3, when the cross sections of the probes 321 and 322 are circular, the probe width W32 is the diameter of the probes 321 and 322. Taking the case where all the cross sections of the probes 321 and 322, and the guide holes 311 and 312 are circular as an example, the probe widths W32 of the probes 321 and 322 (i.e., the diameters of the probes 321 and 322) are smaller than the diameters of the guide holes 311 and 312, and the probe widths W32 of the probes 321 and 322 (i.e., the diameters of the probes 321 and 322) are larger than the opening width W31.

Figure 4:
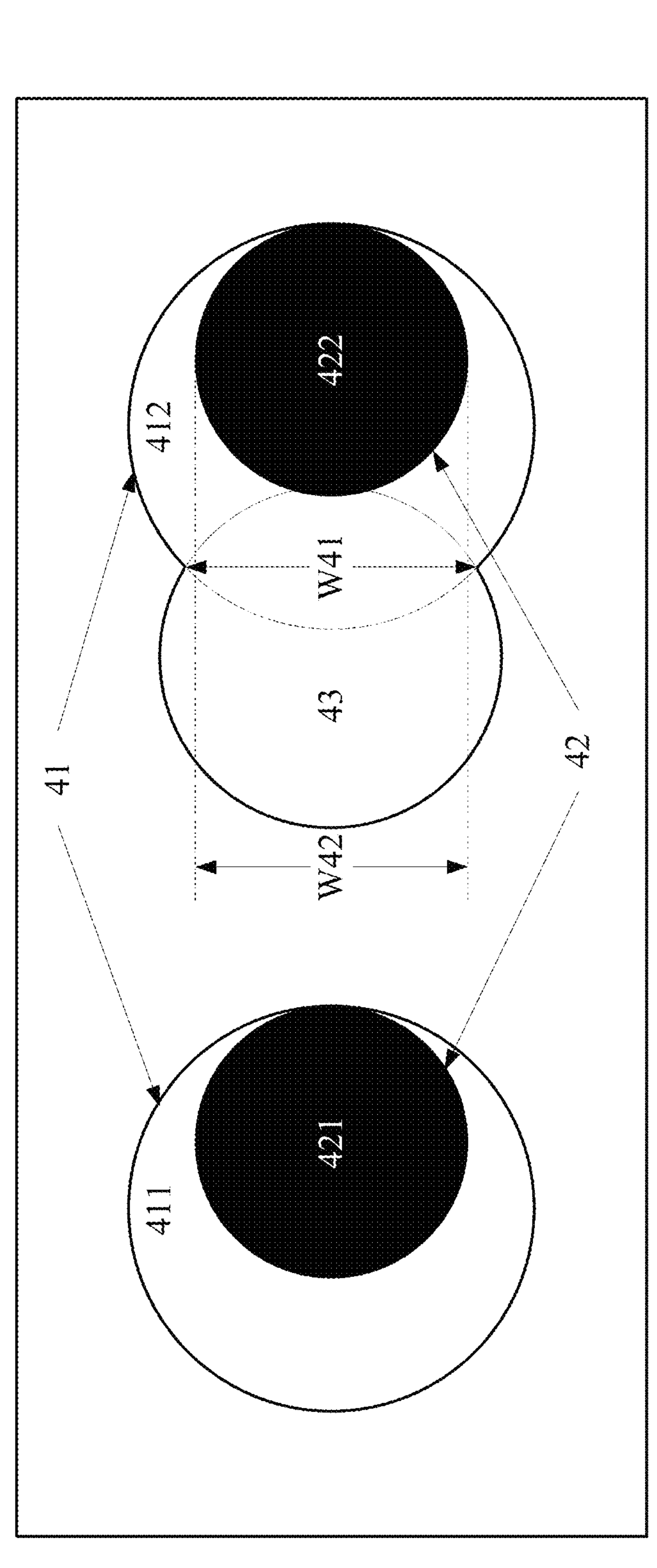

Referring to FIG. 4, which demonstrates, by taking a part of a guide plate 4 as an example, a guide plate structure that may be included in each of at least one upper guide plate comprised in the upper guide plate unit 113*a* and at least one lower guide plate comprised in the lower guide plate unit 113*b*. The guide plate 4 may at least comprise a guide-hole pair 41 for a pair of probes (e.g., a probe pair 42 composed of a probe 421 and a probe 422 as shown in FIG. 4) of the probe head 113 to respectively pass through and extend according to the longitudinal development axis. The guide-hole pair 41 may be configured to slidably accommodate the probe pair 42.

The guide plate 4 may further comprise an extension hole 43 extending from one guide hole 412 to the other guide hole 411 in the guide-hole pair 41. As shown in FIG. 4, the shape of the extension hole 43 may be at least a part of a circle, and there may be an intersection area between the extension hole 43 and the guide hole 412 which together form one substantial guide hole. That is, the guide hole 412 and the extension hole 43 are in communication with each other. In some embodiments, the extension hole 43 may even have a complete circular shape and abut the guide hole 412, thereby forming one substantial guide hole together.

Similar to the above-mentioned extension hole 33, the extension hole 43 may also be hollow. However, different from the extension hole 33, although there may also be a joining position between the extension hole 43 and the guide hole 412, an opening width W41 (e.g., 60 micrometers) of the extension hole 43 at the joining position does not need to be smaller than but may be larger than or equal to a probe width W42 (e.g., 50 micrometers) of the probe pair 42 because the direction in which the extension hole 43 is arranged relative to the guide hole 412 (that is, on the left in the figure) is opposite to the direction in which the probe pair 42 leans on the guide-hole pair 41 (that is, on the right in the figure). However, in some embodiments, the opening width W41 of the extension hole 43 at the joining position may also be smaller than the probe width W42 of the probe pair 42.

The equivalent dielectric constant between the probe pair 42 is decreased because the extension hole 43 is also hollow, similar to the extension hole 33. Therefore, as compared to the guide plate structure shown in FIG. 2, the extension hole 43 also provides a compensating impedance between the guide-hole pair 41, and the compensating impedance is used for improving the impedance matching when probing the device under test 10 with the probe pair 42, so as to reduce a return loss between the probe head 113 and the device under test 10. In addition, as shown in FIG. 4, taking the case where all the cross sections of the probes 421 and 422, and the guide holes 411 and 412 are circular as an example, the probe widths W42 of the probes 421 and 422 (i.e., the diameters of the probes 421 and 422) are smaller than the diameters of the guide holes 411 and 412, and the probe widths W42 of the probes 421 and 422 (i.e., the diameters of the probes 421 and 422) are smaller than the opening width W31.

Figure 5:
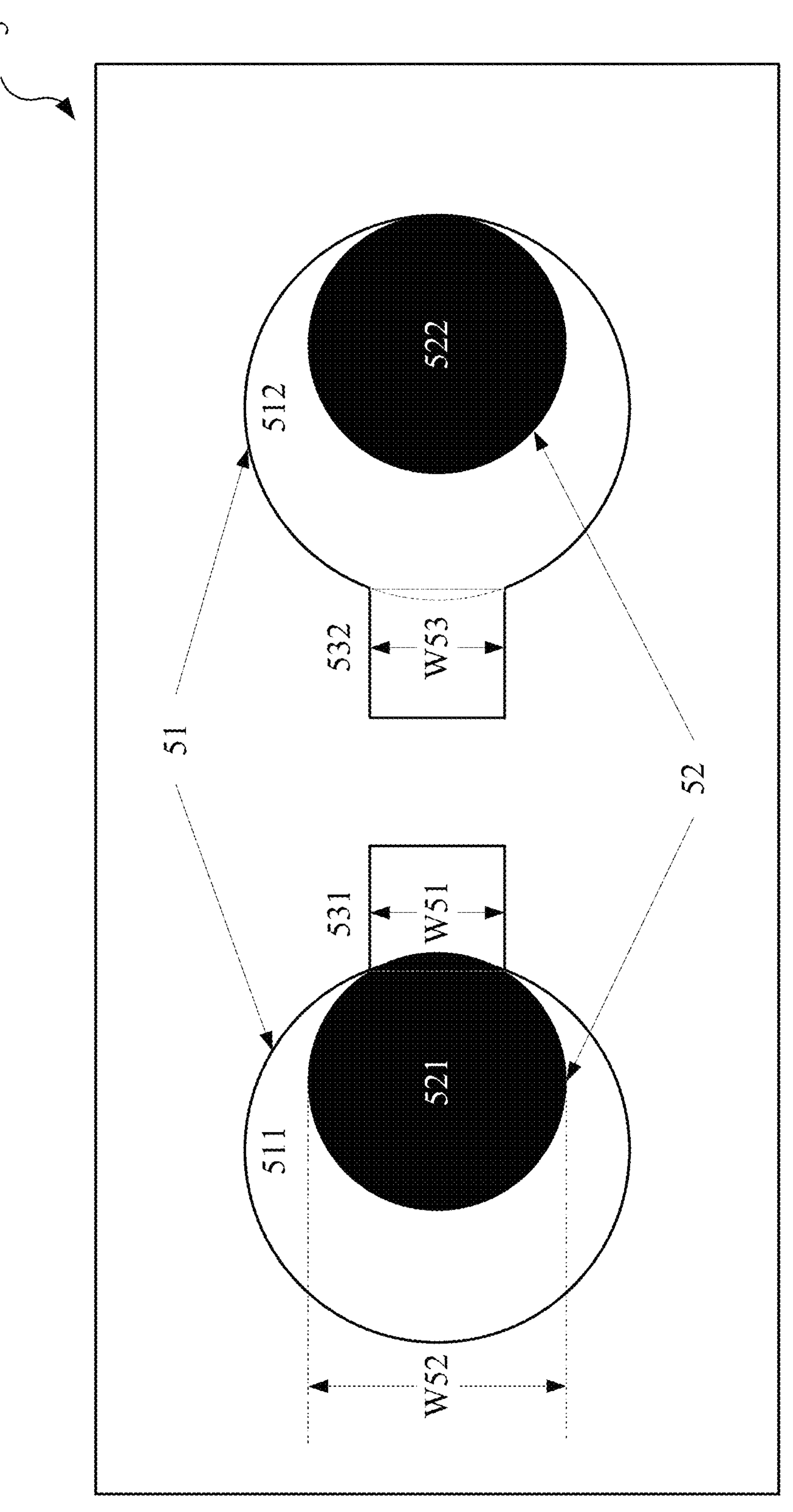

Referring to FIG. 5, which demonstrates, by taking a part of a guide plate 5 as an example, a guide plate structure that may be included in each of at least one upper guide plate comprised in the upper guide plate unit 113*a* and at least one lower guide plate comprised in the lower guide plate unit 113*b*. The guide plate 5 may at least comprise a guide-hole pair 51 for a pair of probes (e.g., a probe pair 52 composed of a probe 521 and a probe 522 as shown in FIG. 5) of the probe head 113 to respectively pass through and extend according to the longitudinal development axis. The guide-hole pair 51 may be configured to slidably accommodate the probe pair 52.

The guide plate 5 may further comprise an extension hole 531 extending from one guide hole 511 to another guide hole 512 in the guide-hole pair 51 and an extension hole 532 extending from the guide hole 512 to the guide hole 511. As shown in FIG. 5, the shape of each of the extension hole 531 and the extension hole 532 may be at least a part of a rectangle. There may be an intersection area between the extension hole 531 and the guide hole 511 which together form one substantial guide hole. Similarly, there may be an intersection area between the extension hole 532 and the guide hole 512 which together form one substantial guide hole. In some embodiments, the extension holes 531 and 532 may even have a complete rectangular shape and respectively abut the guide holes 511 and 512, thereby forming two substantial guide holes together.

Similar to the above-mentioned extension holes 33 and 43, the extension holes 531 and 532 may also be hollow. There may be a joining position between the extension hole 531 and the guide hole 511, and an opening width W51 (for example, 30 micrometers) of the extension hole 531 at the joining position may be smaller than a probe width W52 (for example, 50 micrometers) of the probe pair 52 to prevent the probe 521 from moving into the extension hole 531 from the guide hole 511. On the other hand, although there may also be a joining position between the extension hole 532 and the guide hole 512, it is unnecessary to consider the possibility that the probe 522 moves into the extension hole 532 in this case because the direction in which the extension hole 532 is arranged relative to the guide hole 512 (that is, on the left in the figure) is opposite to the direction in which the probe pair 52 leans on the guide-hole pair 51 (that is, on the right in the figure). Therefore, an opening width W53 (e.g., 60 micrometers) of the extension hole 532 at the joining position does not need to be less than a probe width W52 (e.g., 50 micrometers), but may be less than, greater than or equal to a probe width W52 (e.g., 50 micrometers) of the probe pair 52, although it is still schematically shown that the opening width W53 is less than the probe width W52 in FIG. 5. In other words, in some embodiments, the sizes of the extension holes 531 and 532 need not be the same. However, in some embodiments, like the case illustrated in FIG. 5, the opening width W53 of the extension hole 532 at the joining position may also be smaller than the probe width W52 of the probe pair 52.

The extension holes 531 and 532 may also be hollow, which reduces the equivalent dielectric constant between the probe pair 52. Therefore, as compared to the guide plate structure shown in FIG. 2, the extension holes 531 and 532 together provide a compensating impedance between the guide-hole pair 51, and the compensating impedance is used for improving the impedance matching when probing the device under test 10 with the probe pair 52, so as to reduce a return loss between the probe head 113 and the device under test 10. In addition, as shown in FIG. 5, taking the case where all the cross sections of the probes 521 and 522, and the guide holes 511 and 512 are circular as an example, the probe widths W52 of the probes 521 and 522 (i.e., the diameters of the probes 521 and 522) are smaller than the diameters of the guide holes 511 and 512, and the probe widths W52 of the probes 521 and 522 (i.e., the diameters of the probes 521 and 522) are larger than the opening width W51 and the opening width W53.

Figure 6:
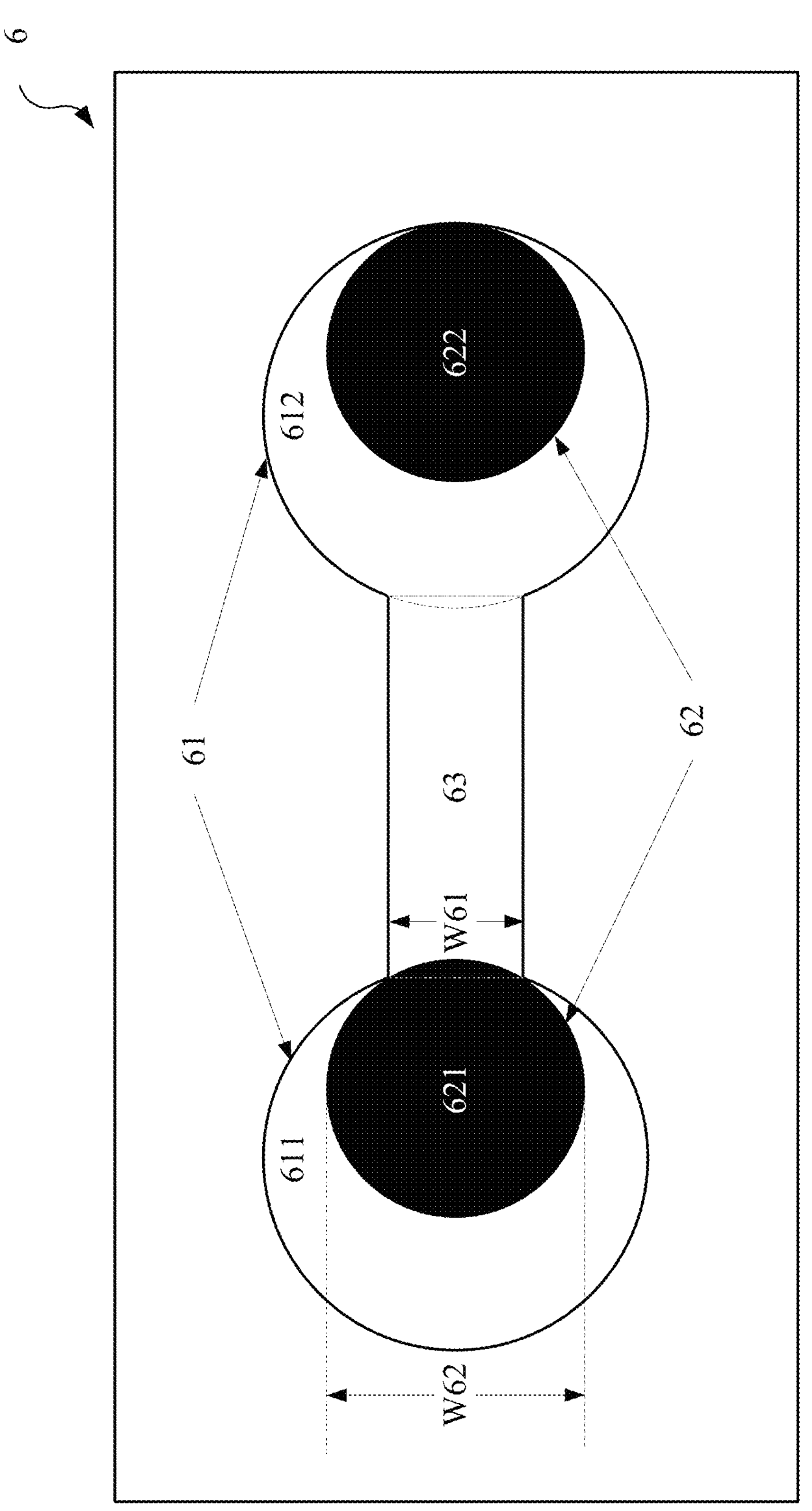

Referring to FIG. 6, which demonstrates a guide plate structure that may be included in each of at least one upper guide plate comprised in the upper guide plate unit 113*a* and at least one lower guide plate comprised in the lower guide plate unit 113*b* by taking a part of a guide plate 6 as an example. The guide plate 6 may at least comprise a guide-hole pair 61 for a pair of probes (e.g., a probe pair 62 composed of a probe 621 and a probe 622 as shown in FIG. 6) of the probe head 113 to respectively pass through and extend according to the longitudinal development axis. The guide-hole pair 61 may be configured to slidably accommodate the probe pair 62.

The difference between the guide plate 6 and the guide plate 5 lies in that the guide plate 6 may comprise an extension hole 63, and this extension hole 63 may be regarded as extending from one guide hole 611 to the other guide hole 612 in the guide-hole pair 61 and may also be regarded as extending from the guide hole 612 to the guide hole 611. As shown in FIG. 6, the shape of the extension hole 63 may be at least a part of a rectangle, and it may be regarded as an aspect in which the aforesaid extension holes 531 and 532 extend towards each other so that the guide holes 611 and 612 are in communication with each other.

The extension hole 63 may also be hollow. There may be a joining position between the extension hole 63 and each of the guide holes 611 and 612, and an opening width W61 (e.g., 30 micrometers) of the extension hole 63 at the joining position with the guide hole 611 may be smaller than a probe width W62 (e.g., 50 micrometers) of the probe pair 62, so as to prevent the probe 621 from moving from the guide hole 611 to the extension hole 63, or even further moving to the guide hole 612 and colliding with the probe 622. As shown in FIG. 6, when the cross sections of the probes 621 and 622 are circular, the probe width W62 is the diameter of the probes 621 and 622.

Because the extension hole 63 is hollow, the equivalent dielectric constant between the probe pair 62 is decreased. Therefore, compared to the guide plate structure shown in FIG. 2, the extension hole 63 provides a compensating impedance between the guide-hole pair 61, and the compensating impedance is used for improving the impedance matching when probing the device under test 10 with the probe pair 62, so as to reduce a return loss between the probe head 113 and the device under test 10.

Figure 7:
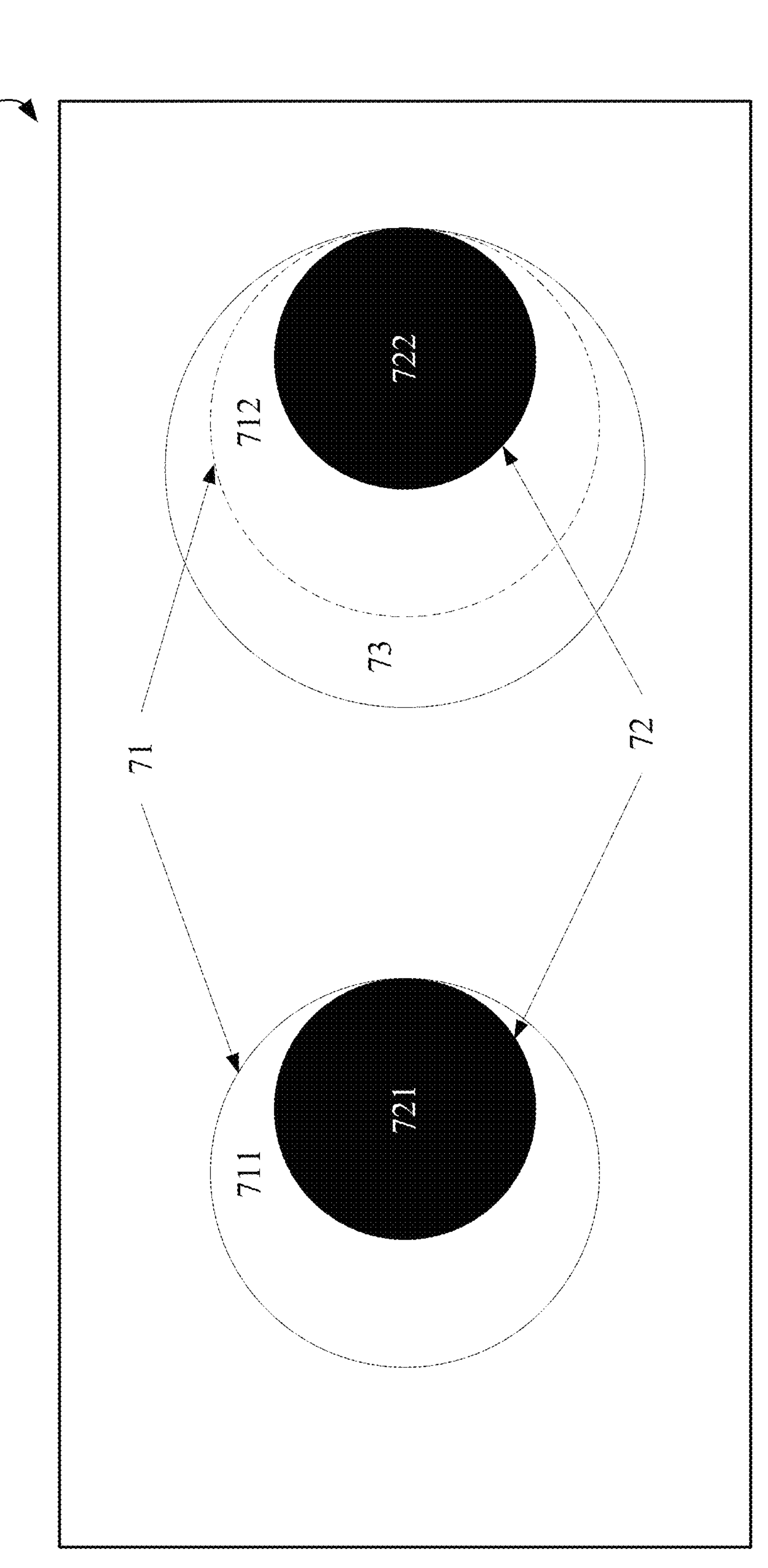

Referring to FIG. 7, which demonstrates, by taking a part of a guide plate 7 as an example, a guide plate structure that may be included in each of at least one upper guide plate comprised in the upper guide plate unit 113*a* and at least one lower guide plate comprised in the lower guide plate unit 113*b*. The guide plate 7 may at least comprise a guide-hole pair 71 for a pair of probes (e.g., a probe pair 72 composed of a probe 721 and a probe 722 as shown in FIG. 7) of the probe head 113 to respectively pass through and extend according to the longitudinal development axis. The guide-hole pair 71 may be configured to slidably accommodate the probe pair 72.

The guide plate 7 may further comprise an extension hole 73 extending from one guide hole 712 to the other guide hole 711 in the guide-hole pair 71. As shown in FIG. 7, the shape of the extension hole 73 may originally be at least a part of a circle, and there may be an intersection area between the extension hole 73 and the guide hole 712 which together form one substantial guide hole. As illustrated in FIG. 7, the intersection area between the originally circular extension hole 73 and the guide hole 712 is the whole guide hole 712, so the extension hole 73 may be regarded as having a meniscus shape as compared to the guide hole 712, and the extension hole 73 and the guide hole 712 together form one substantial circular guide hole. In this case, the guide-hole pair on the guide plate 7 for accommodating the probe pair 72 may be substantially two (i.e., asymmetric) guide holes with one being a larger guide hole and the other being a smaller guide hole, and such arrangement of the guide holes will also make the equivalent dielectric constant between the probe pair 72 lower than that shown in FIG. 2. Therefore, the extension hole 73 equivalently provides a compensating impedance between the guide-hole pair 71, and the compensating impedance is used for improving the impedance matching when probing the device under test 10 with the probe pair 72, so as to reduce a return loss between the probe head 113 and the device under test 10.

Figure 8:
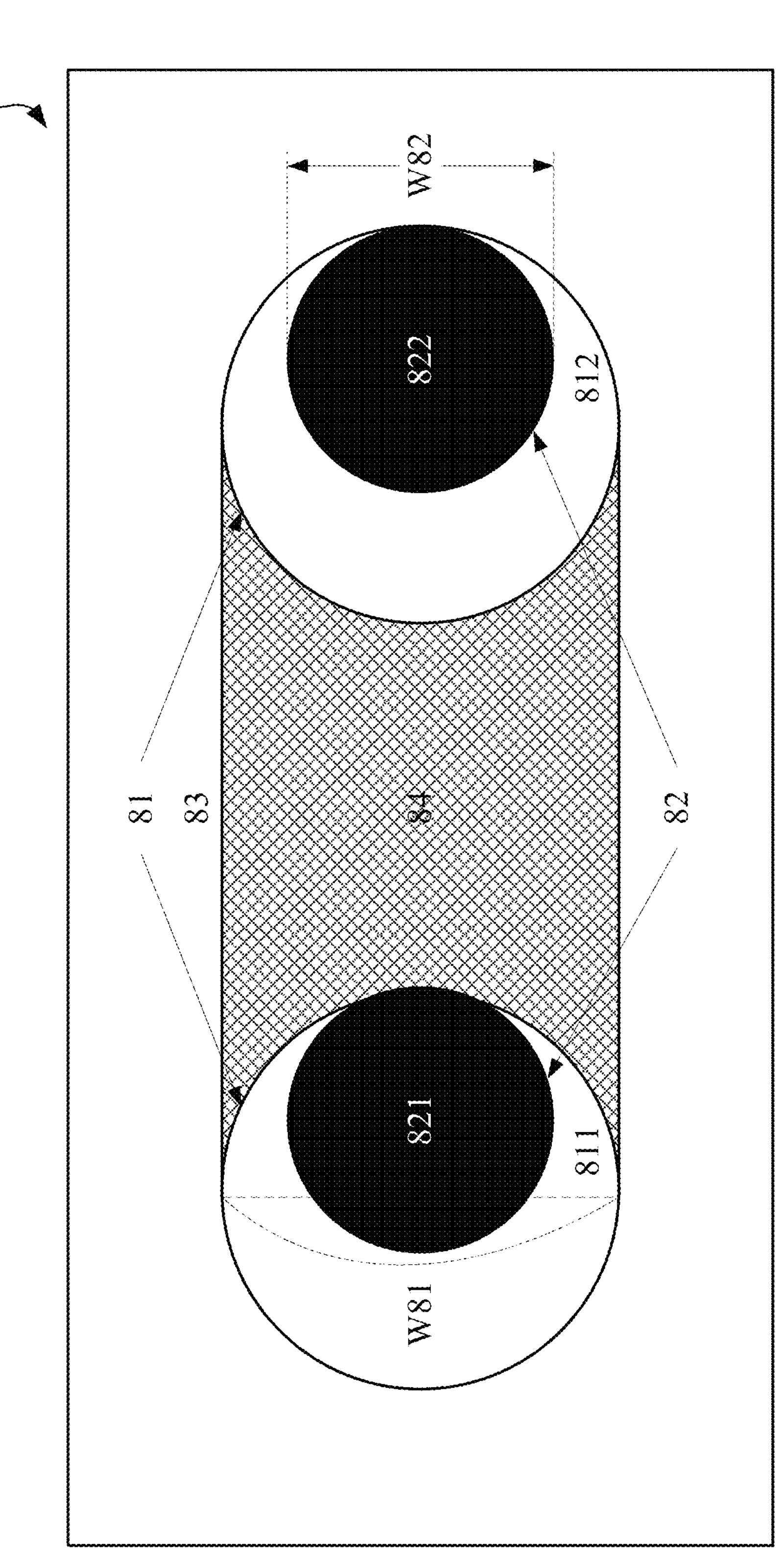

Referring to FIG. 8, which demonstrates, by taking a part of a guide plate 8 as an example, a guide plate structure that may be included in each of at least one upper guide plate comprised in the upper guide plate unit 113*a* and at least one lower guide plate comprised in the lower guide plate unit 113*b*. The guide plate 8 may at least comprise a guide-hole pair 81 for a pair of probes (e.g., a probe pair 82 composed of a probe 821 and a probe 822 as shown in FIG. 8) of the probe head 113 to respectively pass through and extend according to the longitudinal development axis. The guide-hole pair 81 may be configured to slidably accommodate the probe pair 82.

The guide plate 8 may further comprise an extension hole 83, and this extension hole 83 may be regarded as extending from one guide hole 811 to another guide hole 812 in the guide-hole pair 81 and may also be regarded as extending from the guide hole 812 to the guide hole 811. As shown in FIG. 8, the shape of the extension hole 83 may be at least a part of a rectangle, and it may be regarded as an aspect in which the aforesaid extension holes 531 and 532 extend towards each other so that the guide holes 811 and 812 are in communication with each other.

The difference between the extension hole 83 and the aforementioned extension hole 63 lies in that the extension hole 83 may be not completely hollow but partially or completely filled with a material 84 (indicated by crossed lines in the figure). The relative dielectric constant of the material 84 may be lower than that of the material of the guide plate 8 itself. In some embodiments, the material 84 may have a relative dielectric constant of not greater than 6, so as to reduce a return loss between the probe head 113 and the device under test 10, that is, to improve the degree of impedance matching between the probe head 113 and the device under test 10. That is, the material 84 may provide a compensating impedance between the guide-hole pair 81, and the compensating impedance is used for improving the impedance matching when probing the device under test 10 with the probe 82. Furthermore, in some embodiments, the material 84 may even have a relative dielectric constant of not greater than 4. For example, the material 84 may be made of ceramics, porous ceramics, ceramic composite materials or engineering plastics or the like materials. In some embodiments, the material 84 may be a composite material, that is, a material with a relative dielectric constant of not greater than 6 (or even not greater than 4) may be composed of multiple materials.

There may be a joining position between the extension hole 83 and each of the guide hole 811 and the guide hole 812. Because the extension hole 83 is filled with the material 84, an opening width W81 (for example, 60 micrometers) of the extension hole 83 at the joining position with the guide hole 811 does not need to be smaller than a probe width W82 (for example, 50 micrometers) of the probe pair 82 in order to prevent the probe 821 from moving from the guide hole 811 to the extension hole 83, or even further moving into the guide hole 812 and colliding with the probe 822. As shown in FIG. 8, the material 84 in the extension hole 83 may form a part of walls of the guide holes 811 and 812.

Figure 9:
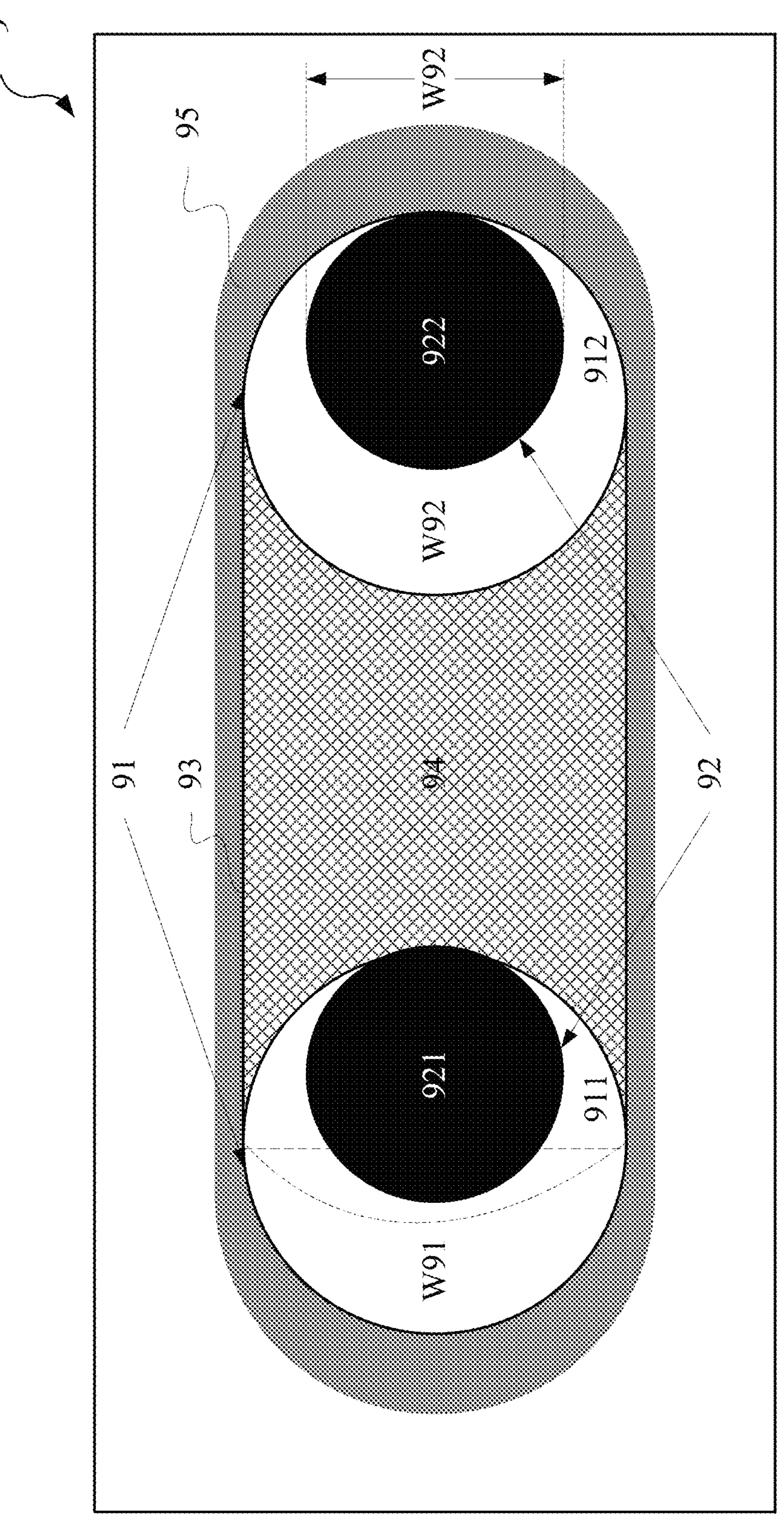

Referring to FIG. 9, which demonstrates a guide plate structure that may be included in each of at least one upper guide plate comprised in the upper guide plate unit 113*a* and at least one lower guide plate comprised in the lower guide plate unit 113*b* by taking a part of a guide plate 9 as an example. The guide plate 9 may at least comprise a guide-hole pair 91 for a pair of probes (e.g., a probe pair 92 composed of a probe 921 and a probe 922 as shown in FIG. 9) of the probe head 113 to respectively pass through and extend according to the longitudinal development axis. The guide-hole pair 91 may be configured to slidably accommodate the probe pair 92.

The guide plate 9 may further comprise an extension hole 93, and this extension hole 93 may be regarded as extending from one guide hole 911 to another guide hole 912 in the guide-hole pair 91, and the extension hole 93 may also be regarded as extending from the guide hole 912 to the guide hole 911. As shown in FIG. 9, the shape of the extension hole 93 may be at least a part of a rectangle, and it may be regarded as a way of embodiment in which two rectangular extension holes extend towards each other to connect with each other so that the guide holes 911 and 912 are in communication with each other.

The difference between the extension hole 93 and the aforementioned extension hole 63 lies in that the extension hole 93 may be not completely hollow but may be partially or completely filled with a material 94. The relative dielectric constant of the material 94 may be lower than that of the material of the guide plate 9 itself. In some embodiments, the material 94 may have a relative dielectric constant of not greater than 6, so as to reduce a return loss between the probe head 113 and the device under test 10, that is, to improve the degree of impedance matching between the probe head 113 and the device under test 10. That is, the material 94 may provide a compensating impedance between the guide-hole pair 91, and the compensating impedance is used for improving the impedance matching when probing the device under test 10 with the probe 92. Furthermore, in some embodiments, the material 94 may even have a relative dielectric constant of not greater than 4. For example, the material 94 may be made of ceramics, porous ceramics, ceramic composite materials or engineering plastics or the like materials. In some embodiments, the material 94 may be a composite material, that is, a material with a relative dielectric constant of not greater than 6 (or even not greater than 4) may be composed of multiple materials.

There may be a joining position between the extension hole 93 and each of the guide hole 911 and the guide hole 912. Because the extension hole 93 is filled with the material 94, an opening width W91 of the extension hole 93 at the joining position with the guide hole 911 (for example, 60 micrometers) may not need to be smaller than a probe width W92 of the probe pair 92 (for example, 50 micrometers) in order to prevent the probe 921 from moving from the guide hole 911 to the extension hole 93, or even further moving into the guide hole 912 and colliding with the probe 922. As shown in FIG. 9, the material 94 in the extension hole 93 may form a part of walls of the guide holes 911 and 912.

The difference between the guide plate 9 and the guide plate 8 lies in that, the periphery of the guide-hole pair 91 and the extension hole 93 may be further covered with another material 95 to form a reinforcement member. When the device under test 10 is tested with the probe pair 92, the reinforcement member can share the force during the test together with the guide-hole pair 91, the probe pair 92 and the extension hole 93 (and the material 94 therein), so as to enhance the operation stability of the guide-hole pair 91, the probe pair 92 and the extension hole 93 (and the material 94 therein). In some embodiments, the material 95 may be a metal, such as stainless steel, and the material 95 may comprise an insulating layer at the inner edge in contact with the guide-hole pair 91, the probe pair 92 and the extension hole 93 (and the material 94 therein) so as not to affect the signal transmission of the probe pair 92. However, in some embodiments, the material 95 may also be nonmetal, such as high-strength ceramics.

It shall be appreciated that, although the aspect in which the periphery of the guide-hole pair and the extension hole is covered with a reinforcement material is only depicted in FIG. 9 among the attached drawing, actually, in some embodiments, the periphery of the guide-hole pair and the extension hole may still be covered with the reinforcement member with the material 95 even if the extension hole is not filled with a material (e.g., in the guide plates 3 to 7 mentioned above).

Figure 10:
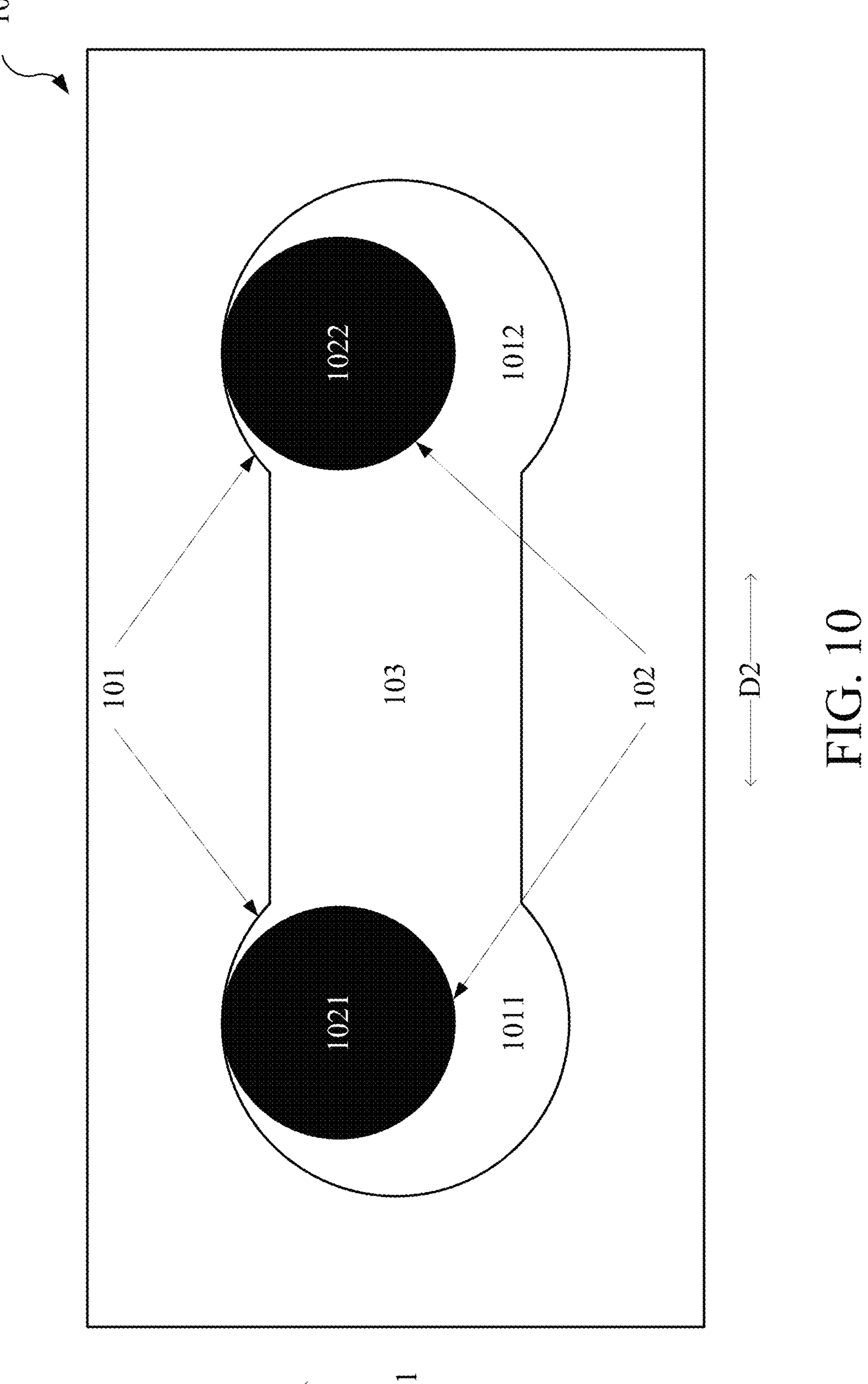

Referring to FIG. 10, which demonstrates, by taking a part of a guide plate 10 as an example, a guide plate structure that may be included in each of at least one upper guide plate comprised in the upper guide plate unit 113*a* and at least one lower guide plate comprised in the lower guide plate unit 113*b*. The guide plate 10 may at least comprise a guide-hole pair composed by a guide hole 1011 and a guide hole 1012 for a pair of probes (e.g., a probe pair composed of a probe 1021 and a probe 1022 as shown in FIG. 10) of the probe head 113 to respectively pass through and extend according to the longitudinal development axis. The guide-hole pair may be configured to slidably accommodate the probe pair.

The guide plate 10 may comprise an extension hole 103, and the extension hole 103 may make the guide hole 1011 and the guide hole 1012 communicate with each other. As shown in FIG. 10, the shape of the extension hole 105 may be at least a part of a rectangle. In addition, the extension hole 103 may be hollow, which reduces the equivalent dielectric constant between the probe 1021 and the probe 1022.

Therefore, as compared to the guide plate structure shown in FIG. 2, the extension hole 103 provides a compensating impedance between the guide hole 1011 and the guide hole 1012, and this compensating impedance is used for improving the impedance matching when probing the device under test 10 with the probes 1021 and 1022 and reduces a return loss between the probe head 113 and the device under test 10.

As shown in FIG. 10, the probes 1021 and 1022 respectively lean on the guide holes 1011 and 1012 in the up direction (that is, a leaning direction D1) in the figure. The leaning direction D1 may be not parallel to a guide hole arrangement direction D2 between the guide holes 1021 and 1022, so that the probe 1021 will not move from the guide hole 1011 to the extension hole 103 and/or the guide hole 1012 and collide with the probe 1022 even if an opening width at the joining position between the extension hole 103 and the guide holes 1031 and 1032 is not less than a probe width of the probes 1021 and 1022 as illustrated in FIG. 10. The leaning direction D1 is not parallel to the guide hole arrangement direction D2, specifically, the leaning direction D1 may be perpendicular to the guide hole arrangement direction D2, or an acute angle included between the leaning direction D1 and the guide hole arrangement direction D2 may be not less than 30 degrees.

It shall be appreciated that the respective guide holes are depicted in FIG. 3 to FIG. 10 as circular-shaped only for convenience of description. In fact, in some embodiments, the respective guide holes in each guide-hole pair may substantially have the shape of a circle or a polygon (e.g., a rectangle, a trapezoid, a parallelogram, etc.). In addition, in some embodiments where the guide holes are polygonal, the two guide holes in each guide-hole pair may also each be arranged with the shortest sides of the polygons opposite to each other. That is, the two guide holes in each guide-hole pair may be arranged with the width sides opposite to each other when taking the rectangular guide holes as an example. At the same time, it shall be appreciated that, the cross-sections of the respective probes are shown as circles in FIG. 3 to FIG. 10 only for convenience of description. In fact, in some embodiments, the cross sections of the respective probes are not limited to circles, but may be of different shapes, such as a rectangle, a trapezoid or a parallelogram. Of course, the cross-sectional shapes of these probes are not geometrically perfect, but instead have tolerances and manufacturing errors as objects. In addition, in some embodiments, normally the shapes of the cross sections of the probes are arranged corresponding to the shapes of the guide holes. For example, a probe with a circular cross section may be used in combination with a circular guide hole, or a probe with a rectangular cross section may be used in combination with a rectangular guide hole, or a probe with a trapezoidal cross section may be used in combination with a rectangular guide hole.

Although the respective extension holes are presented as at least a part of a circle, an ellipse or a rectangle in the contents described above with reference to FIG. 3 to FIG. 10, this is only for convenience of description. In some embodiments, the extension hole may also be a combination of parts of the shapes or a combination of all of the shapes described above.

In some embodiments, the perimeter of the extension hole may be not greater than the perimeter of the guide hole, as illustrated in FIG. 3, FIG. 4, FIG. 5, and FIG. 10.

In some embodiments, the guide plate may further comprise another guide-hole pair in addition to the guide-hole pair shown in FIG. 3 to FIG. 10, for another pair of probes of the probe head 113 to respectively pass through and extend according to the longitudinal development axis. The direction of a center-connecting-line between the other guide-hole pair may be not parallel to the direction of a center-connecting-line between the guide-hole pair shown in FIG. 3 to FIG. 10, that is, the guide plate may simultaneously comprise guide-hole pairs with different guide hole arrangement directions.

Figure 11:
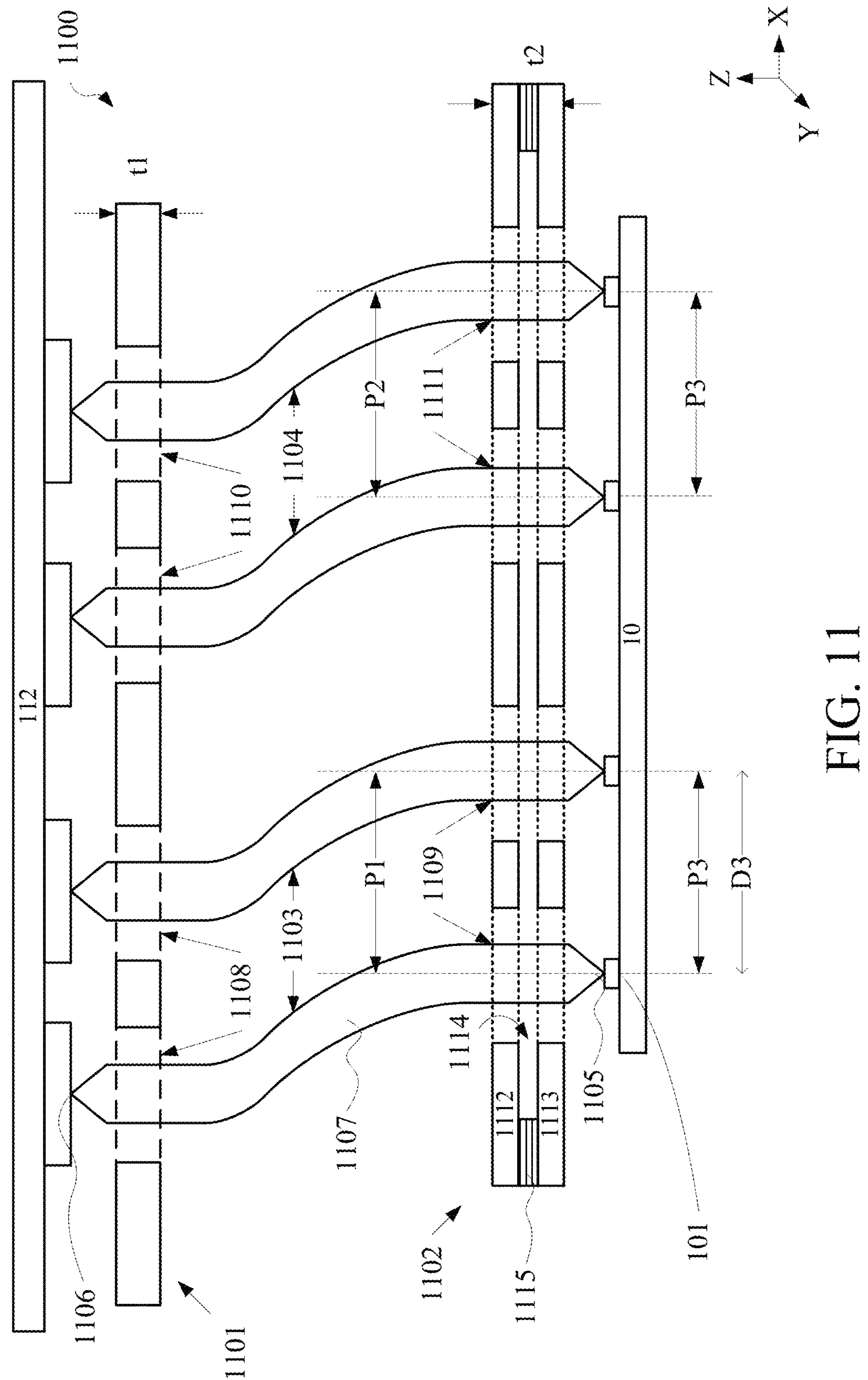
FIG. 11 illustrates a wafer testing system in which a probe head and a guide plate structure are located according to one or more embodiments of the present invention, with the probes therein being straight probes.

Referring to FIG. 11, which demonstrates, by taking a probe head 1100 as an example, the arrangement of probes and guide plate structures that may be included in the probe head 113 of the probe card 11. The probe head 1100 may be used to replace the probe head 113 shown in FIG. 1. The probe head 1100 may be mechanically arranged on and/or electrically connected to the wafer side of the space transformer 112. The probe head 1100 may comprise an upper guide plate unit, a lower guide plate unit and a plurality of probes. The upper guide plate unit may comprise at least one upper guide plate, such as an upper guide plate 1101 shown in FIG. 11. The lower guide plate unit may comprise at least a lower guide plate, such as a lower guide plate 1102 shown in FIG. 11. Hereinafter, the at least one upper guide plate comprised in the upper guide plate unit and the at least one lower guide plate comprised in the lower guide plate unit will be exemplified by the upper guide plate 1101 and the lower guide plate 1102, respectively.

The upper guide plate 1101 and the lower guide plate 1102 may be vertically arranged opposite to each other along a longitudinal development axis (substantially along the Z-axis direction of the local reference system in the figure). The upper guide plate 1101 may be provided with a plurality of upper guide holes, while the lower guide plate 1102 may be provided with a plurality of lower guide holes. Both the upper guide plate 1101 and the lower guide plate 1102 may have one of the guide plate structures previously described herein with respect to FIG. 3 to FIG. 10. In other words, the plurality of upper guide holes and the plurality of lower guide holes may be the guide-hole pairs on the respective guide plate structures previously described herein with reference to FIG. 3 to FIG. 10, and there may be various types of extension holes between the respective guide-hole pairs. However, FIG. 11 is depicted from the perspective of a side view to illustrate the arrangement relationships between the guide plates and the probes, and thus the extension holes are not shown between the respective guide-hole pairs in FIG. 11.

The upper guide plate 1101 and the lower guide plate 1102 may be separated by a distance, and may each comprise a plurality of guide holes corresponding to the plurality of probes so as to slidably accommodate a probe in each guide hole, and the guide holes accommodating the same probe in the upper guide plate 1101 and the lower guide plate 1102 correspond to each other. In practical application, the upper guide plate 1101 and the lower guide plate 1102 may be offset on the XY plane to assist the contact probe to bend in the air gap. In FIG. 11, in order to simplify the explanation, only some of multiple probes usually included in a probe head 1100 are depicted in the figure.

As shown in FIG. 11, the upper guide plate 1101 may comprise a guide-hole pair 1108, while the lower guide plate 1102 may comprise a guide-hole pair 1109. The guide-hole pair 1108 and the guide-hole pair 1109 may be used to accommodate a probe pair 1103. Similarly, the upper guide plate 1101 may further comprise another guide-hole pair 1110, while the lower guide plate 1102 may comprise another guide-hole pair 1111, and the guide-hole pair 1110 and the guide-hole pair 1111 may be used to accommodate a probe pair 1104. The probe pair 1103 and/or the probe pair 1104 are a differential pair that transmits a pair of differential signals.

In some embodiments, a thickness t2 of the lower guide plate 1102 may be not less than a thickness t1 of the upper guide plate 1101. For example, when the thickness t2 of the lower guide plate 1102 is greater than the thickness t1 of the upper guide plate 1101, it can provide better support for the probe when the probe slides and moves in the guide-hole pair 1109 and the guide-hole pair 1111, so that the probe can slide and move up and down more smoothly in the guide-hole pair 1109 and the guide-hole pair 1111. However, in some other embodiments, the thickness of the upper guide plate 1101 may instead be not less than that of the lower guide plate 1102.

In some embodiments, the upper guide plate 1101 and/or the lower guide plate 1102 may be a multilayer guide plate having a multilayer structure. In FIG. 11, the lower guide plate 1102 is shown as a multilayer guide plate, but in some embodiments, the upper guide plate 1101 may also be a multilayer guide plate. The multilayer guide plate may at least have a first layer and a second layer, and an air layer may be interposed between the first layer and the second layer. Each probe in the probe head 1100 may penetrate through the first layer, the air layer and the second layer. For example, the multilayer lower guide plate 1102 may have a first layer 1112 and a second layer 1113, and an air layer 1114 may be interposed between the first layer 1112 and the second layer 1113. The air layer 1114 may be formed by separating the first layer 1112 from the second layer 1113 by a frame 1115 (indicated by horizontal lines in the figure) of the lower guide plate 1102. The guide-hole pair 1109 may penetrate through the first layer 1112, the air layer 1114 and the second layer 1113, and the probe pair 1103 may respectively penetrate through the guide holes in the guide-hole pair 1109. However, the multilayer guide plate is not limited to comprising two layers. That is, in some embodiments, each multilayer guide plate may comprise more than two layers.

The probe head 1100 may further comprise a plurality of probes, such as a probe pair 1103 and a probe pair 1104 shown in FIG. 11 for transmitting differential signals in pairs. Each probe passes through one of the plurality of upper guide holes and one of the plurality of lower guide holes. In addition, each probe may comprise a first end, and the first end may end at a contact tip and may be configured to abut a contact pad of the device under test 10. For example, an end 1105 shown in FIG. 11 is configured to abut a contact pad 101 of the device under test 10. Each probe may further comprise a second end, such as an end 1106 shown in FIG. 11, and the second end may end at a contact bottom and may be configured to abut a corresponding contact pad of the space transformer 112.

Each probe may further comprise a probe body which extends between the first end and the second end according to a longitudinal development axis. For example, a probe body 1107 shown in FIG. 11 extends between the end 1105 and the end 1106 according to a longitudinal development axis. Each probe body may have a transverse diameter, which is a maximum transverse dimension of an extension and/or a cross section of the cross section of the probe. The cross section is not necessarily a circle and may be taken from a plane perpendicular to the longitudinal development axis (that is, perpendicular to the Z-axis direction in the figure). The probe body preferably has a square or rectangular cross section. According to some embodiments of the present invention, the probe may be a probe that is called a "buckling beam" in the art. That is, the probe has a constant and preferably square or rectangular cross section over its entire length, wherein the probe body is deformed and suitable for bending at a substantially central position, such that the probe body can be further deformed during the testing of the device under test. In some embodiments, the probe does not necessarily have a constant cross section over its entire length.

The probe pair 1103, the probe pair 1104, and other probes in the probe head 1100 may all be in the form of straight probes. In some embodiments, the spacing between the corresponding centers of the probe pair 1103 may have a first relative distance P1. The first relative distance P1 may range from 80 micrometers to 220 micrometers, and preferably may range from 100 micrometers to 130 micrometers. Similarly, in some embodiments, the spacing between the corresponding centers of the probe pair 1104 may have a second relative distance P2. The second relative distance P2 may also range from 80 micrometers to 220 micrometers, and preferably may range from 100 micrometers to 130 micrometers.

Specifically, the first relative distance P1 may be a center spacing corresponding to the first end (the contact tip) of the probe pair 1103 or a center spacing corresponding to the second end (the contact bottom) of the probe pair 1103, and it corresponds to a center spacing of the corresponding pair of contact pads in the device under test 10. In some embodiments, the center spacing corresponding to the first end (the contact tip) of the probe pair 1103 may be equal to the center spacing corresponding to the second end (the contact bottom) of the probe pair 1103. Similarly, the second relative distance P2 may be a center spacing corresponding to the first end (the contact tip) of the probe pair 1104 or a center spacing corresponding to the second end (the contact bottom) of the probe pair 1104, and it corresponds to a center spacing of the corresponding pair of contact pads in the device under test 10. In some embodiments, the center spacing corresponding to the first end (the contact tip) of the probe pair 1104 may be equal to the center spacing corresponding to the second end (the contact bottom) of the probe pair 1104. In some embodiments, the center spacing of each pair of contact pads corresponding to each probe pair in the device under test 10 may be a third relative distance P3, and the first relative distance P1 and/or the second relative distance P2 may be smaller than the third relative distance P3.

In some embodiments, the probe length of each probe pair in the probe head 1100 according to the longitudinal development axis may range between 3 millimeters and 7 millimeters. In some embodiments, the probe length may also be not greater than 6 millimeters or even preferably not greater than 4 millimeters.

In some embodiments, the thickness of the contact tip of each of the probe pair 1103, the probe pair 1104 and other probe pairs in the probe head 1100 in a direction D3 of a probe-center-connecting line corresponding to the respective probe pairs may be greater than the thickness of the remaining parts of the first end (i.e., other parts except for the contact tip) in the direction D3 of the probe-center-connecting line, and even further greater than the thickness of the probe body (the pin body) in the direction D3 of the probe-center-connecting line in some embodiments. In order to achieve this result, the contact tip may be thickened in the production process (for example, the contact tip is entirely covered and thickened as a whole, or the contact tip is only partially thickened in the direction D3 of the probe-center-connecting line), but the way in which the contact tip is thickened is not limited to electroplating. For example, for MEMS wires, the thickness of the contact tip may be increased through MEMS process. When the contact tips of the probe pairs 1103, 1104 are thickened, the contact areas thereof with the contact pads of the device under test will also be increased, thereby providing a more stable contact mode. Especially, when the return loss between the probe head and the device under test is reduced for impedance matching, the spacing between the corresponding centers of the probe pair 1103 is reduced, that is, the first relative distance P1 is reduced to be less than the third relative distance P3, and at this point, the thickened contact tip can still normally contact the contact pad.

In some embodiments, when the probe is a pre-bent (e.g., Cobra) probe (as described later for FIG. 12), the width of the probe body may still be greater than the thickness of the thickened contact tip because the probe body is processed by stamping in the production process, so as to prevent the probe from slipping out of the guide hole of the guide plate. The thickness of the thickened contact tip may be greater than or equal to a remaining part of the first end and/or the probe body preferably by 2% to 20%, and more preferably by 10%. The increase in thickness of the thickened contact tip may range from 1 to 5 micrometers, and preferably may range from 1 to 2 micrometers. Taking the case where the contact tip is thickened (that is, the diameter is increased) by electroplating (e.g., in the case of Cobra) as an example, when the thickness of the first end of the probe is 50 micrometers, a thickness of 1 to 2 micrometers may be formed at the contact tip, and at this point, the thickness of the thickened contact tip is 52 to 54 micrometers.

Figure 12:
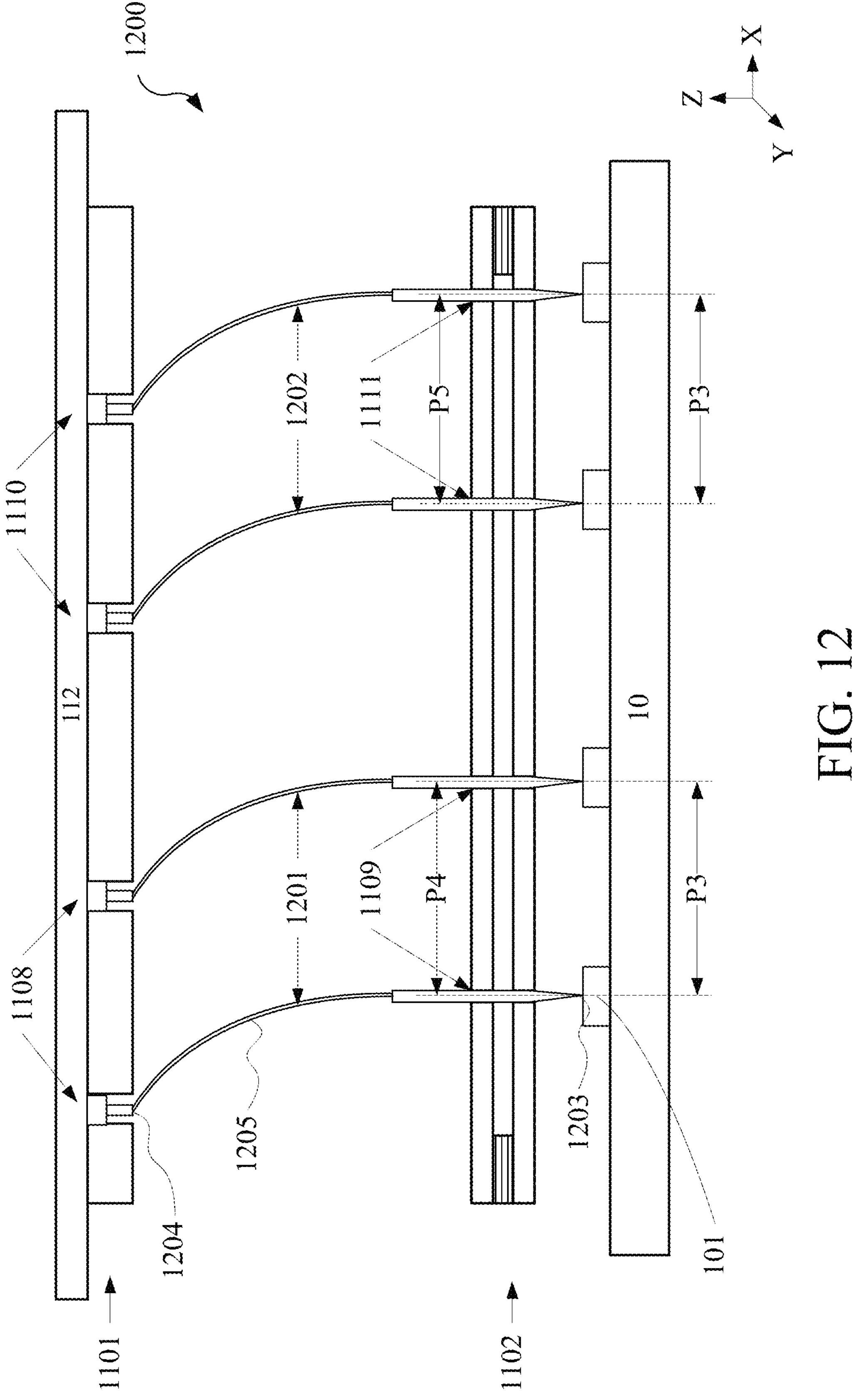
FIG. 12 illustrates a wafer testing system in which a probe head and a guide plate structure are located according to one or more embodiments of the present invention, with the probes therein being pre-bent probes.

Referring to FIG. 12, which demonstrates the arrangement of probes and guide plate structures that may be included in the probe head 113 of the probe card 11 by taking a probe head 1200 as an example. The probe head 1200 may also be used to replace the probe head 113 shown in FIG. 1. The probe head 1200 is different from the probe head 1100 in that a plurality of probes included in the probe head 1200 may be pre-bent probes, such as a probe pair 1201 and a probe pair 1202 shown in FIG. 12 for transmitting differential signals in pairs. Each probe passes through one of the plurality of upper guide holes and one of the plurality of lower guide holes. In addition, each probe may comprise a first end, and the first end may end at a contact tip and may be configured to abut a contact pad of the device under test 10. For example, an end 1203 shown in FIG. 12 is configured to abut a contact pad 101 of the device under test 10. Each probe may further comprise a second end, such as an end 1204 shown in FIG. 12, and the second end may end at a contact bottom and may be configured to abut a corresponding contact pad of the space transformer 112.

Each probe may further comprise a probe body which extends between the first end and the second end according to a longitudinal development axis. For example, a probe body 1205 shown in FIG. 12 extends between the end 1203 and the end 1204 according to a longitudinal development axis. Each probe body may have a transverse diameter, which is a maximum transverse dimension of an extension and/or a cross section of the cross section of the probe. The cross section is not necessarily a circle and may be taken from a plane perpendicular to the longitudinal development axis (that is, perpendicular to the Z-axis direction in the figure). The probe body preferably has a square or rectangular cross section, and the probe body may have a flat shape because it has been processed by stamping in the production process.

The probe head 1200 may comprise the upper guide plate 1101 and the lower guide plate 1102 in the probe head 1100. Both the guide-hole pair 1108 included in the upper guide plate 1101 and the guide-hole pair 1109 included in the lower guide plate 1102 may be used to accommodate the probe pair 1201. Similarly, the guide-hole pair 1110 included in the upper guide plate 1101 and the guide-hole pair 1111 included in the lower guide plate 1102 may be used to accommodate the probe pair 1202.

In some embodiments, the spacing between the corresponding centers of the probe pair 1201 may have a fourth relative distance P4. The fourth relative distance P4 may range from 80 micrometers to 220 micrometers, and preferably may range from 100 micrometers to 130 micrometers. Similarly, in some embodiments, the spacing between the corresponding centers of the probe pair 1202 may have a fifth relative distance P5. The fifth relative distance P5 may also range from 80 micrometers to 220 micrometers, and preferably may range from 100 micrometers to 130 micrometers. Specifically, the fourth relative distance P4 may be a center spacing corresponding to the first end (the contact tip, e.g., the end 1203 shown in FIG. 12) of the probe pair 1201 or a center spacing corresponding to the second end (the contact bottom, e.g., the end 1204 shown in FIG. 12) of the probe pair 1201, and it corresponds to a center spacing (e.g., the third relative distance P3) of the corresponding pair of contact pads in the device under test 10. In some embodiments, the center spacing corresponding to the first end (the contact tip) of the probe pair 1201 may be equal to the center spacing corresponding to the second end (the contact bottom) of the probe pair 1201. Similarly, the fifth relative distance P5 may be a center spacing corresponding to the first end (the contact tip) of the probe pair 1202, or a center spacing corresponding to the second end (the contact bottom) of the probe pair 1202, and it corresponds to a center spacing (e.g., the third relative distance P3) of the corresponding pair of contact pads in the device under test 10. In some embodiments, the center spacing corresponding to the first end (the contact tip) of each probe pair may be equal to the center spacing corresponding to the second end (the contact bottom). In some embodiments, the center spacing of each pair of contact pads corresponding to each probe pair in the device under test 10 may be a third relative distance P3, and the fourth relative distance P4 and/or the fifth relative distance P5 may be smaller than the third relative distance P3.

Although the probes are depicted as straight probes in FIG. 1 and FIG. 11, this is not a limitation on the type of probes applicable to the present invention. In fact, the probes applicable to the present invention may at least include straight probes (as illustrated in FIG. 1 and FIG. 11, wherein FIG. 11 is the assembled state of a straight probe offset from a flat plate) or pre-bent probes (as illustrated in FIG. 12) or the like. More specifically, the straight probe may be, for example, a forming wire (FW), a MEMS (i.e., microelectromechanical systems) wire (MW), or a pogo pin or the like. The pre-bent probe may be, for example, a Cobra probe or a MEMS pre-bent forming wire or the like.

The type of so-called vertical probe head basically comprises a plurality of contact probes held by at least one pair of flat plates (guide plates) or by flat plate-like guides which are substantially parallel to each other. The flat plate-like guides may be provided with specific holes (e.g., guide holes) and may be configured to be separated from each other by a specific distance, so as to reserve a free space or an air gap 117 for the movement and possible deforming of the contact probe. This pair of guide plates especially comprises an upper guide plate and a lower guide plate, both of which are provided with individual guide holes, and the contact probes pass through the guide holes in an axially slidable manner, and the probes are usually made of special metals with good electrical and mechanical properties. A good connection between the contact probe and the contact pad of the device under test is ensured by pressing the test head on the component itself. During pressurized contact, the probe may be slidably contacted inside the guide holes in the upper and lower guide plates, which causes bending in the air gap between the two guide plates and causing sliding inside the guide holes.

In addition, the bending of the contact probes (e.g., the forming wire or the MEMS wire among straight probes as illustrated in FIG. 11) in the air gap may be assisted by properly configuring the probes themselves (such as the pre-bent probes as illustrated in FIG. 12) or the guide plates thereof. In FIG. 11, in order to simplify the explanation, only some contact probes among a plurality of probes usually contained in a test head are depicted in the figure, and the test head is of the so-called offset flat plate type (which is suitable for the forming wire or the MEMS wire among the straight probes). Specifically, the respective centers of the upper guide holes and the lower guide holes corresponding to each other may be misaligned with each other, that is, the center-connecting line between the upper guide hole and the lower guide hole is not parallel to a longitudinal direction. The longitudinal direction may be direction parallel to the Z axis in the local reference system of the drawing, and it is perpendicular to a reference plane 118. The reference plane 118 may correspond to a horizontal development plane of the guide plates. Accordingly, the contact probes accommodated in the guide holes of the upper guide plate and the lower guide plate are deformed with respect to a longitudinal development axis thereof (corresponding to the Z-axis direction of the local reference system of the drawing), and the longitudinal development axis is set to be perpendicular to the reference plane 118. The upper guide plate and the lower guide plate may be parallel to each other and extend along the reference plane 118, and the semiconductor wafer, the device under test 10 and the plates of the space transformer 112 may also develop along the reference plane 118.

When the probe in the vertical probe head is of a pre-bent probe type, e.g., in the example of a test head made of Cobra in the prior art, as shown in FIG. 12, the contact probe will have a pre-deformed configuration with an offset between the contact tip portion and the contact bottom portion which have been defined in the placement conditions of the probe head. Especially in this example, the contact probe comprises a pre-deformed part, which may assist the proper bending of the contact probe even when the test head is not in contact with the device under test. The contact probe is further deformed during its operation, i.e., when it is pressed to contact the device under test. It shall be noted that for proper probe head operation, the contact probe may have proper freedom of axial movement inside the guide holes. In this way, these contact probes may also be extracted and replaced when a single probe fails, without being forced to replace the entire probe head. The freedom of axial movement (especially when the probe slides inside the guide hole) is in contrast with the normal safety requirements of the probe head during its operation.

Figure 13:
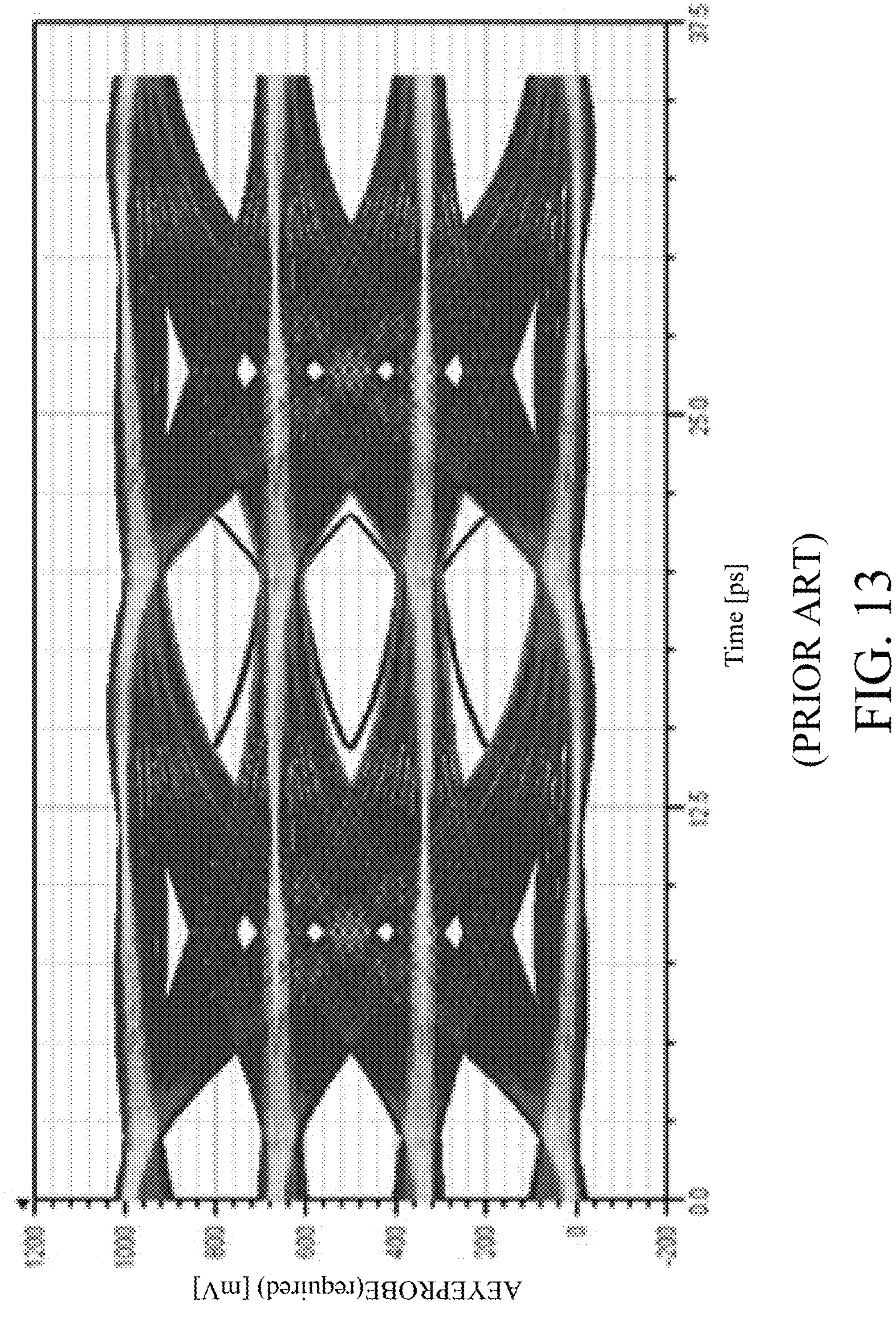
FIG. 13 is an eye diagram when a device under test is tested based on the guide plate structure in the prior art.
Figure 14:
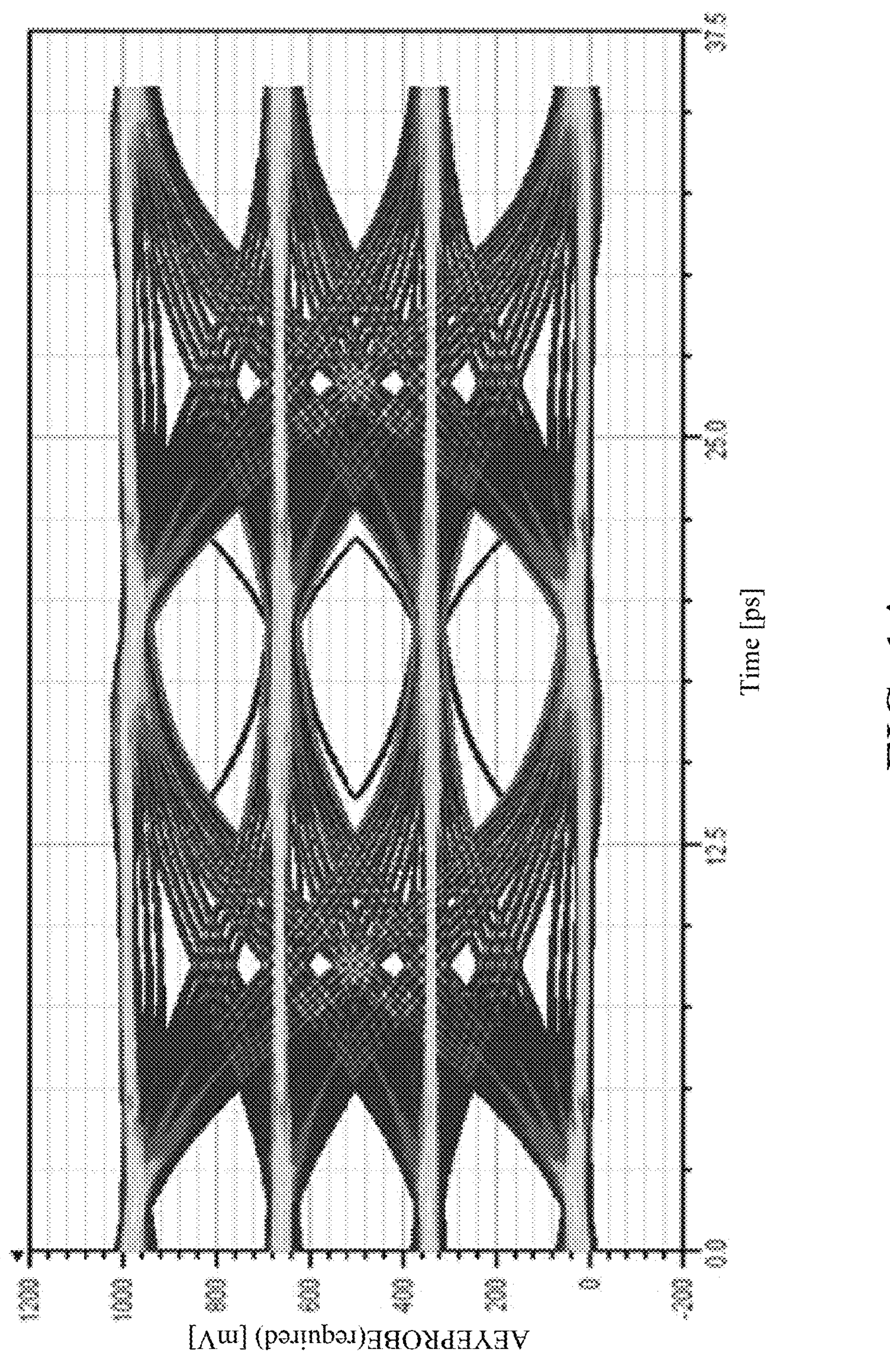
FIG. 14 is an eye diagram when a device under test is tested based on a guide plate structure according to one or more embodiments of the present invention.

Next, please refer to FIG. 13 and FIG. 14 together. FIG. 13 is an eye diagram when a device under test is tested based on a guide plate structure in the prior art (i.e., a structure without an extension hole), and FIG. 14 is an eye diagram when a device under test is tested based on a guide plate structure according to one or more embodiments of the present invention (i.e., a structure with an extension hole generally speaking). In FIG. 13, the eye height is about 188 millivolts (mV), and the eye width is about 7.82 picoseconds (ps). In FIG. 14, the eye height is 231 millivolts, and the eye width is about 8.14 picoseconds. As compared to FIG. 13, the eye height in FIG. 14 is improved by 1.23 times, and the eye width is improved by 1.04 times. As can be clearly seen by comparing the two figures, the guide plate structure provided according to the present invention is provided with the extension hole between the guide-hole pair for accommodating the differential pair of probes, and thus as compared to the transmission of differential-pair signals without the extension hole in the prior art, the guide plate structure of the present invention reduces the equivalent dielectric constant between the differential pair of probes, thereby effectively reducing the impedance fluctuation caused by the guide plate between the pair of probes, and further reducing the return loss between the probe head as a whole and the object to be tested. That is, the impedance matching between the probe head (even the probe card to which the probe head belongs) as a whole and the object to be tested is improved, thereby improving the signal integrity.

The above disclosure is related to the detailed technical contents and inventive features thereof. People of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

The invention claimed is:

1. A guide plate structure of a probe head of a probe system for testing a device under test integrated in a semiconductor wafer, comprising:
- a first guide plate, comprising:
  - a pair of first guide holes, for a pair of probes of the probe head to respectively pass through and extend according to a longitudinal development axis, and the pair of first guide holes being configured to slidably accommodate the pair of probes; and
  - a first extension hole extending from one of the pair of first guide holes to the other, the first extension hole being configured to provide a compensating impedance between the pair of first guide holes, and the compensating impedance being used to improve impedance matching when probing the device under test with the pair of probes so as to reduce a return loss between the probe head and the device under test, wherein:
    - there is a joining position between the first extension hole and one of the pair of first guide holes; and
    - an opening width of the first extension hole at the joining position is smaller than a probe width of the pair of probes, so as to prevent one of the pair of probes from moving into the first extension hole from one of the pair of first guide holes.

2. The guide plate structure of claim 1, further comprising:
- a second guide plate, being separated from the first guide plate by a distance along the longitudinal development axis, and comprising:
  - a pair of second guide holes corresponding to the pair of first guide holes for the pair of probes of the probe head to pass through respectively; and
  - a second extension hole extending from at least one of the pair of second guide holes to the other, the second extension hole being configured to provide a compensating impedance between the pair of second guide holes, and the compensating impedance being used to improve the impedance matching when probing the device under test with the pair of probes so as to reduce the return loss between the probe head and the device under test.

3. The guide plate structure of claim 2, wherein the first guide plate and the second guide plate respectively have a thickness along the longitudinal development axis, the thickness of the first guide plate is not less than that of the second guide plate, and the first guide plate is arranged closer to the device under test than the second guide plate.

4. The guide plate structure of claim 1, wherein the first guide plate has a first layer and a second layer with an air layer interposed between the first layer and the second layer, and the pair of probes penetrate through the first layer, the air layer and the second layer.

5. The guide plate structure of claim 2, wherein at least one of the first guide plate and the second guide plate has a first layer and a second layer with an air layer interposed between the first layer and second layer, and the pair of probes penetrate through the first layer, the air layer and the second layer.

6. The guide plate structure of claim 1, wherein:

each of the pair of first guide holes is provided in the shape of a circle, a rectangle, a trapezoid, or a parallelogram; and the first extension hole has any one of, or any combination of, at least a part of a circle, at least a part of an ellipse, and at least a part of a rectangle.

7. The guide plate structure of claim 2, wherein:

each of the pair of first guide holes and the pair of second guide holes is provided in the shape of a circle, a rectangle, a trapezoid, or a parallelogram; and the first extension hole has any one of, or any combination of, at least a part of a circle, at least a part of an ellipse, and at least a part of a rectangle, and the second extension hole has any one of, or any combination of, at least a part of a circle, at least a part of an ellipse, and at least a part of a rectangle.

8. The guide plate structure of claim 1, wherein the first guide plate further comprises a pair of third guide holes which are configured for another pair of probes of the probe head to respectively pass through and extend according to the longitudinal development axis, the pair of third guide holes are configured to slidably accommodate the other pair of probes, and an arrangement direction of two guide holes of the pair of third guide holes is different from an arrangement direction of the pair of first guide holes.

9. The guide plate structure of claim 2, wherein:

the first guide plate further comprises a pair of third guide holes which are configured for another pair of probes of the probe head to respectively pass through and extend according to the longitudinal development axis, the pair of third guide holes are configured to slidably accommodate the other pair of probes, and the arrangement direction of two guide holes of the pair of third guide holes is different from that of the pair of first guide holes; and the second guide plate further comprises a pair of fourth guide holes corresponding to the pair of third guide holes, the pair of fourth guide holes are used for the other pair of probes of the probe head to respectively pass through, and an arrangement direction of two guide holes of the pair of fourth guide holes is different from an arrangement direction of the pair of second guide holes.

10. The guide plate structure of claim 1, wherein:

a perimeter of the first extension hole is not greater than a perimeter of one of the pair of first guide holes.

11. The guide plate structure of claim 2, wherein:

a perimeter of the first extension hole is not greater than a perimeter of one of the pair of first guide holes;

a perimeter of the second extension hole is not greater than a perimeter of one of the pair of second guide holes;

the joining position between the first extension hole and one of the pair of first guide holes is a first joining position;

the opening width of the first extension hole at the first joining position is smaller than the probe width of the pair of probes so as to prevent one of the pair of probes from moving into the first extension hole from one of the pair of first guide holes;

there is a second joining position between the second extension hole and one of the pair of second guide holes; and an opening width of the second extension hole at the second joining position is smaller than the probe width so as to prevent one of the pair of probes from moving into the second extension hole from one of the pair of second guide holes.

12. The guide plate structure of claim 1, wherein an arrangement direction of two guide holes of the pair of first guide holes is not parallel to a leaning direction in which the pair of probes lean on the pair of first guide holes.

13. The guide plate structure of claim 2, wherein an arrangement direction of two guide holes of the pair of first guide holes is not parallel to a leaning direction in which the pair of probes lean on the pair of first guide holes, and an arrangement direction of two guide holes of the pair of second guide holes is not parallel to a leaning direction in which the pair of probes lean on the pair of second guide holes.

14. The guide plate structure of claim 1, wherein the first extension hole is filled with a first material, and the first material has a relative dielectric constant not greater than 6.

15. The guide plate structure of claim 2, wherein:

the first extension hole is filled with a first material, the first material having a relative dielectric constant not greater than 6; and the second extension hole is filled with a second material, the second material having a relative dielectric constant not greater than 6.

16. The guide plate structure of claim 1, wherein the first guide plate further comprises a first reinforcement member, and the first reinforcement member surrounds the pair of first guide holes and the first extension hole.

17. The guide plate structure of claim 2, wherein:

the first guide plate further comprises a first reinforcement member which surrounds the pair of first guide holes and the first extension hole; and the second guide plate further comprises a second reinforcement member which surrounds the pair of second guide holes and the second extension hole.

18. A probe head of a probe system for testing a device under test integrated in a semiconductor wafer, comprising:

the pair of probes of claim 1, each probe of the pair of probes comprising:

a first end, ending at a contact tip and being configured to abut a contact pad of the device under test;

a second end, ending at a contact bottom and being configured to abut a contact pad of a board of the probe system; and a probe body, extending between the first end and the second end according to a longitudinal development axis; and the guide plate structure of claim 1.

19. The probe head of claim 18, wherein:

a probe spacing of the pair of probes ranges from 80 micrometers to 220 micrometers; and a length of the pair of probes is not greater than 6 millimeters.

20. The probe head of claim 18, wherein a thickness of the contact tip of each probe of the pair of probes in a direction of a probe-center-connecting line corresponding to the pair of probes is greater than a thickness of a remaining part of the first end of the same probe in the direction of the probe-center-connecting line or greater than a thickness of the probe body of the same probe in the direction of the probe-center-connecting line.

21. The probe head of claim 20, wherein the thickness of the contact tip of each probe of the pair of probes is greater than the thickness of the remaining part of the first end of the same probe in the direction of the probe-center-connecting line or greater than the thickness of the probe body of the same probe in the direction of the probe-center-connecting line by 2% to 20%.

22. The probe head of claim 18, wherein:

the pair of probes is configured for transmitting or receiving differential signals;

a probe spacing of the pair of probes is smaller than a center spacing of two contact pads of the device under test corresponding to the pair of probes; and the pair of probes are straight probes or pre-bent probes.

23. A probe card of a probe system for testing a device under test integrated in a semiconductor wafer, comprising:

a circuit board;

a space transformer arranged on the circuit board; and the probe head of claim 18, being arranged on a side of the space transformer opposite to the circuit board, and the second end of each probe of the pair of probes of the probe head is configured to electrically connect with the space transformer.

24. A probe system for functional testing of a device under test integrated in a semiconductor wafer, comprising:

a chuck for supporting the semiconductor wafer;

a testing apparatus, being configured to electrically connect with the device under test for establishing an electrical testing program; and a probe card of claim 23, being provided in the probe system.

* * * * *